(12) United States Patent
Hwang et al.

(10) Patent No.: US 11,101,378 B2
(45) Date of Patent: Aug. 24, 2021

(54) SEMICONDUCTOR STRUCTURE HAVING BOTH ENHANCEMENT MODE GROUP III-N HIGH ELECTRON MOBILITY TRANSISTORS AND DEPLETION MODE GROUP III-N HIGH ELECTRON MOBILITY TRANSISTORS

(71) Applicant: Raytheon Company, Waltham, MA (US)

(72) Inventors: Kiuchul Hwang, Amherst, NH (US); Brian D. Schultz, Lexington, MA (US); John Logan, Lawrence, MA (US); Christos Thomidis, Watertown, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/379,077

(22) Filed: Apr. 9, 2019

(65) Prior Publication Data
US 2020/0328296 A1    Oct. 15, 2020

(51) Int. Cl.
| H01L 29/778 | (2006.01) |
| H01L 21/223 | (2006.01) |
| H01L 29/20 | (2006.01) |
| H01L 29/207 | (2006.01) |
| H01L 29/66 | (2006.01) |

(52) U.S. Cl.
CPC ...... H01L 29/7786 (2013.01); H01L 21/2233 (2013.01); H01L 29/2003 (2013.01); H01L 29/207 (2013.01); H01L 29/66431 (2013.01)

(58) Field of Classification Search
CPC .............. H01L 29/7786; H01L 21/2233; H01L 29/2003; H01L 29/207; H01L 29/66431; H01L 29/7783; H01L 27/0629

USPC .................... 257/194, 189, 195; 438/48, 285
See application file for complete search history.

(56) References Cited

U.S. PATENT DOCUMENTS

| 6,534,801 | B2 | 3/2003 | Yoshida |
| 6,583,449 | B2 | 6/2003 | Northrup et al. |
| 7,728,356 | B2 | 6/2010 | Suh et al. |
| 7,795,642 | B2 | 9/2010 | Suh et al. |
| 7,939,391 | B2 | 5/2011 | Suh et al. |
| 7,972,915 | B2 | 7/2011 | Chen et al. |
| 8,044,432 | B2 | 10/2011 | Chen et al. |

(Continued)

FOREIGN PATENT DOCUMENTS

| JP | 2000068498 | 3/2000 |
| JP | 2005235935 | 9/2005 |

OTHER PUBLICATIONS

Amano, et al.; "P-Type Conduction in Mg-Doped GaN Treated with Low-Energy Electron Beam Irradiation (LEEBI)"; Japanese Journal of Applied Physics; vol. 28; No. 12; pp. L 2112-L 2114; Dec. 1989; 4 Pages.

(Continued)

*Primary Examiner* — Thinh T Nguyen
(74) *Attorney, Agent, or Firm* — Daly, Crowley, Mofford & Durkee, LLP

(57) ABSTRACT

An Enhancement-Mode HEMT having a gate electrode with a doped, Group III-N material disposed between an electrically conductive gate electrode contact and a gate region of the Enhancement-Mode HEMT, such doped, Group III-N layer increasing resistivity of the Group III-N material to deplete the 2DEG under the gate at zero bias.

14 Claims, 16 Drawing Sheets

(56) References Cited

U.S. PATENT DOCUMENTS

| | | |
|---|---|---|
| 8,344,420 B1 | 1/2013 | Jimenez |
| 8,470,652 B1 | 6/2013 | Brown et al. |
| 8,519,438 B2 | 8/2013 | Mishra et al. |
| 8,629,479 B2 | 1/2014 | Nakata et al. |
| 8,748,244 B1 | 6/2014 | Corrion et al. |
| 8,841,702 B2 | 9/2014 | Mishra et al. |
| 8,895,993 B2 | 11/2014 | Kalnitsky et al. |
| 9,196,716 B2 | 11/2015 | Mishra et al. |
| 9,263,439 B2 | 2/2016 | Zhang |
| 9,306,009 B2 | 4/2016 | Hallin et al. |
| 9,419,125 B1 | 8/2016 | Schultz et al. |
| 9,437,708 B2 | 9/2016 | Mishra et al. |
| 9,525,413 B2 | 12/2016 | Roberts et al. |
| 9,620,598 B2 | 4/2017 | Liu et al. |
| 9,911,868 B2 | 3/2018 | Tanaka |
| 9,941,384 B2 | 4/2018 | You et al. |
| 10,038,070 B2 | 7/2018 | Tanaka et al. |
| 10,276,705 B2 | 4/2019 | Schultz et al. |
| 10,644,127 B2 | 5/2020 | Moens et al. |
| 2002/0096692 A1 | 7/2002 | Nakamura et al. |
| 2010/0258842 A1 | 10/2010 | Lidow et al. |
| 2010/0258848 A1 | 10/2010 | Lidow et al. |
| 2012/0193637 A1 | 8/2012 | Kalnitsky et al. |
| 2013/0009165 A1* | 1/2013 | Park et al. .......... H01L 27/0629 257/76 |
| 2013/0240949 A1 | 9/2013 | Yamada |
| 2014/0042452 A1 | 2/2014 | Pendharkar et al. |
| 2015/0021616 A1 | 1/2015 | Lee et al. |
| 2017/0170283 A1 | 6/2017 | Laboutin et al. |
| 2017/0256407 A1 | 9/2017 | Tajiri et al. |
| 2018/0308966 A1 | 10/2018 | Jacquet et al. |
| 2019/0198654 A1* | 6/2019 | Lin et al. ............ H01L 29/7789 |
| 2019/0371930 A1 | 12/2019 | Shrivastava et al. |
| 2021/0050215 A1 | 2/2021 | Agata et al. |

OTHER PUBLICATIONS

Bernardini, et al.; "Theoretical evidence for efficient ρ-type doping of GaN using beryllium"; Applied Physics Letters; vol. 70; Issue 22; Oct. 1996; 3 Pages.

Fujieda, et al; Growth Characterization of Low-Temperature MOCVD GaN_Comparison between $N_2H_4$ and $NH_3$; Japanese Journal of Applied Physics; vol. 26; No. 12; pp. 2067-2071; Dec. 1987; 5 Pages.

Greco, et al.; "Review of technology for normally-off HEMTs with p-GaN gate"; Materials Science in Semiconductor Processing 78; pp. 96-106; 2018; 11 Pages.

Green; "Polarity control during molecular beam epitaxy growth of Mg-doped GaN"; American Vacuum Society; J. Vac. Sci. Technol. B; vol. 21; No. 4; JVST B—Microelectronics and Nanometer Structures; pp. 1804-1811; Jul./Aug. 2003; 8 Pages.

Hasegawa, et al.; "Current Transport, Fermi Level Pinning, and Transient Behavior of Group-III Nitride Schottky Barriers"; Journal of the Korean Physical Society; vol. 55; No. 3; pp. 1167-1179; Sep. 2009; 13 Pages.

Heikman, et al.; "Non-planar Selective Area Growth and Characterization of GaN and AlGaN"; Jpn. J. Appl. Phys.; vol. 42; Part 1; No. 10; pp. 6276-6283; Oct. 2003; 8 Pages.

Katzer, et al.; "Molecular beam epitaxy of beryllium-doped GaN buffer layers for AlGan/GaN HEMTs"; Journal of Crystal Growth 251; pp. 481-486; 2003; 6 Pages.

Latham, et al.; "Calculated properties of point defects in Be-doped GaN"; The American Physical Society; Physical Review B 67, 205206; 2003; 8 Pages.

Lee, et al; "Compensation in Be-doped Gallium Nitride Grown Using Molecular Beam Epitaxy"; Material Research Society; vol. 892; pp. 729-733; 2006; 5 Pages.

Lyons, et al.; "First-principles theory of acceptors in nitride semiconductors"; Wiley Online Library; Phys. Status Solidi B 252; No. 5; pp. 900-908; Apr. 6, 2015; 9 Pages.

Lyons, et al.; Impact of Group-II Acceptors on the Electrical and Optical Properties of GaN; Japanese Journal of Applied Physics 52; 2013; 5 Pages.

Lyons, et al.; "Shedding light on doping of gallium nitride"; SPIE Newsroom; Jul. 19, 2012; 3 Pages.

Meneghini, et al.; Technology and Reliability of Normally-Off GaN HEMTs with p-Type Gate; MDPI; Energies 2017; vol. 10; Issue 153; Jan. 25, 2017; 15 Pages.

Roberts, et al.; Control of threshold voltage in E-mode and D-mode GaN-on-Si metal-insulator-semiconductor heterostructure field effect transistors by in-situ fluorine doping of atomic layer deposition Al2O3 gate dielectrics; Applied Physics Letters 108, 072901; 2016; 6 Pages.

Sokolich; "What is Fermi-level pinning, and how could it affect the behavior of the semiconductor?"; Oct. 3, 2018; 6 Pages.

Storm, et al.; "Reduction of buffer layer conduction near plasma-assisted molecular-beam epitaxy grown GaN/AlN interfaces by beryllium doping"; Applied Physics Letters; vol. 81; No. 20; Nov. 11, 2002; 3 Pages.

Van de Walle, et al.; "First-principles studies of beryllium doping of GaN"; The American Physical Society; Physical Review B; vol. 63, 245205; Jun. 8, 2001; 17 Pages.

Yang, et al.; "Mg incorporation in GaN grown by plasma-assisted molecular beam epitaxy at high temperatures"; Journal of Crystal Growth 439; pp. 87-92; 2016; 11 Pages.

Yuliang, et al.; "AlGaN/GaN high electron mobility transistors with selective area grown p-GaN gates"; Journal of Semiconductors; vol. 37; No. 11; May 6, 2016; 3 Pages.

Chih-Hao Li, Yan-Cheng Jiang, Hsin-Chang Tsai, Yi-Nan Zhong, Yue-ming Hsin², Device Characteristics of AlGaN/GaN HEMTs with [-GaN Cap Layer, ECS Journal of Solid State Science and Technology, Jul. 30, 2019, JSS Focus Issue On GaN-Based Electronics for Power, RF, and Rad-Hard Applications, pp. S3125-S328, 4 pages.

D.F. Storm, D.S. Katzer, D.A. Deen, R. Bass, D.J. Meyer, J.A. Roussos, S.C. Binari, T. Paskova, E.A. Preble, K.R. Evans, Proximity effects of beryllium-doped GaN buffer layers on the electronic properties of epitaxial AlGaN/GaN heterostructures, Solid-State Electronics, 2010, 4 pages, pp. 1470-1473.

John J. Lyons, Anderson Janotti, Chris G. Van De Walle, Impact of Group-II Acceptors on the Electrical and Optical Properties of GaN, Japanese Journal of Applied Physics 52, 2013, 5 pages, pp. 08JJ04-1-08JJ04-5.

Fabio Bernardini, Vincenzo Fiorentini, Andrea Bosin, Theoretical evidence for efficient ρ-type doping of GaN using beryllium, INFM-Dipartimento di Scienze Fisiche, Universitá di Cagliari, via Ospedale 72, I-09124 Cagliari, Italy, TECHSO, S.p.A, Elmas (CA) Italy, Sep. 3, 2018, 3 pages, pp. 1-3.

K. Lee, B. Vanmil, M. Luo, T.H. Myers, A. Armstrong, S.A. Ringel, M. Rummukainen, K. Saarinen, Compensation in Be-doped Gallium Nitride Grown Using Molecular Beam Epitaxy, Mater, Res. Soc. Symp. Proc. vol. 892 © 2006 Materials Research Society, 5 pages, pp. 729-733.

Robert P. Vaudo, Xueping Xu, Allan Salant, Joseph Malcarne, George R. Brandes, Characteristics of semi-insulating, Fe-doped GaN substrates, physica status solidi (a)/ vol. 200, issue 1, Oct. 9, 2003, 11 pages.

D.F. Storm, D.S. Katzer, D.A. Deen, R. Bass, D.J. Meyer, J.A. Roussos, Reduction of buffer layer condition near plasma-assisted molecular-beam, epitaxy grown GaN/AlN interfaces by beryllium doping, Applied Physics Letters, vol. 81, No. 20, Nov. 11, 2002,, 3 pages, p. 3819.

Chris G. Van De Walle, Sukit Limpijumnong, Jörg Neugebauer, First-Principles studies of beryllium doping of GaN, Physical Review B, vol. 63, 24505, 2001, 17 pages, pp. 245205-1-245205-17.

Subramaniam Arulkumran, Takashi Egawa, Hiroyasu Ishikawa, Studies on the Influences of i-GaN, n-DaN, p-GaN and InGaN Cap Layers in AlGaN/GaN High-Electron-Mobility Transistors, Japanese Journal of Applied Physics, vol. 44, No. 5A. 2005, published May 10, 2005, pp. 2953-2960, 8 pages.

(56) References Cited

OTHER PUBLICATIONS

Storm, et al.; "Proximity effects of beryllium-doped GaN buffer layers on the electronic properties of epitaxial AlGaN/GaN heterostructures"; Solid State Electronics 54; pp. 1470-1473; Jun. 26, 2010; 4 Pages.
Notification of Transmittal of the International Search Report and the Written Opinion of the International Searching Authority, or the Declaration, PCT/US2020/022228, dated Jun. 29, 2020, 1 page.
International Search Report, PCT/US2020/022228, dated Jun. 29, 2020, 5 pages.
Written Opinion of the International Searching Authority, PCT/US2020/022228, dated Jun. 29, 2020, 10 pages.
Notification of Transmittal of the International Search Report and the Written Opinion of the ISA, or the Declaration, dated Feb. 17, 2021 for International Application No. PCT/US2020/058656; 1 Page.
International Search Report dated Feb. 17, 2021 for International Application No. PCT/US2020/058656; 5 Pages.
Written Opinion of the ISA dated Feb. 17, 2021 for International Application No. PCT/US2020/058656; 10 Pages.
D.F. Storm, et al., Proximity effects of beryllium-doped GaN buffer layers on the electronic properties of epitaxial AlGaN heterostructures, Solid State Electronics 54, 2010, pp. 1470-1473, 4 pages.
Taiwan IPO Search Report, with English Translation, Application No. 109108964, dated Nov. 24, 2020, 2 pages.
Non Final Office Action dated Apr. 26, 2021, U.S. Appl. No. 16/727,252, 22 pages.
C. Poblenz et al., Effect of carbon doping on buffer leakage in AlGaN/GaN high electron mobility transistors, American Vacuum Society, May 24, 2004, pp. 1145-1149, 5 pages.
W.R. Willoughby et al., Photo-EPR study of compensated defects in Be-doped GaN substrates, Journal of Applied Physics, Feb. 15, 2019, pp. 075701-075701-8, 9 pages.
U. Birkle et al., Studies on Carbon as Alternative P-Type Dopant for Gallium Nitride, MRS Internet J. Nitride Semicond. Res. 4S1, G5.6 (1999), 6 pages.
W.R. Willoughby et al., A compensating point defect in carbon-doped GaN substrates studied with electron paramagnetic resonance spectroscopy, Journal of Applied Physics, Dec. 18, 2017, pp. 161547-161547-5, 6 pages.

\* cited by examiner

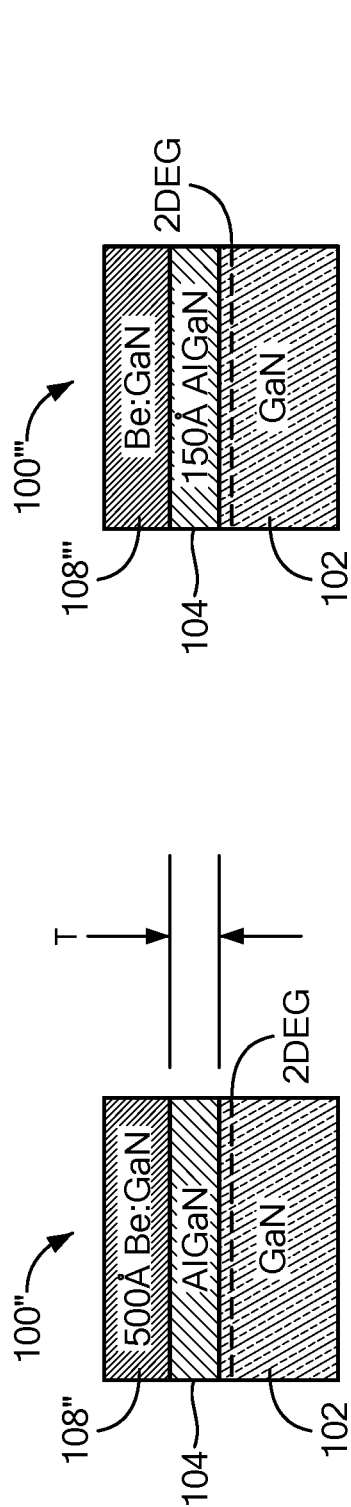
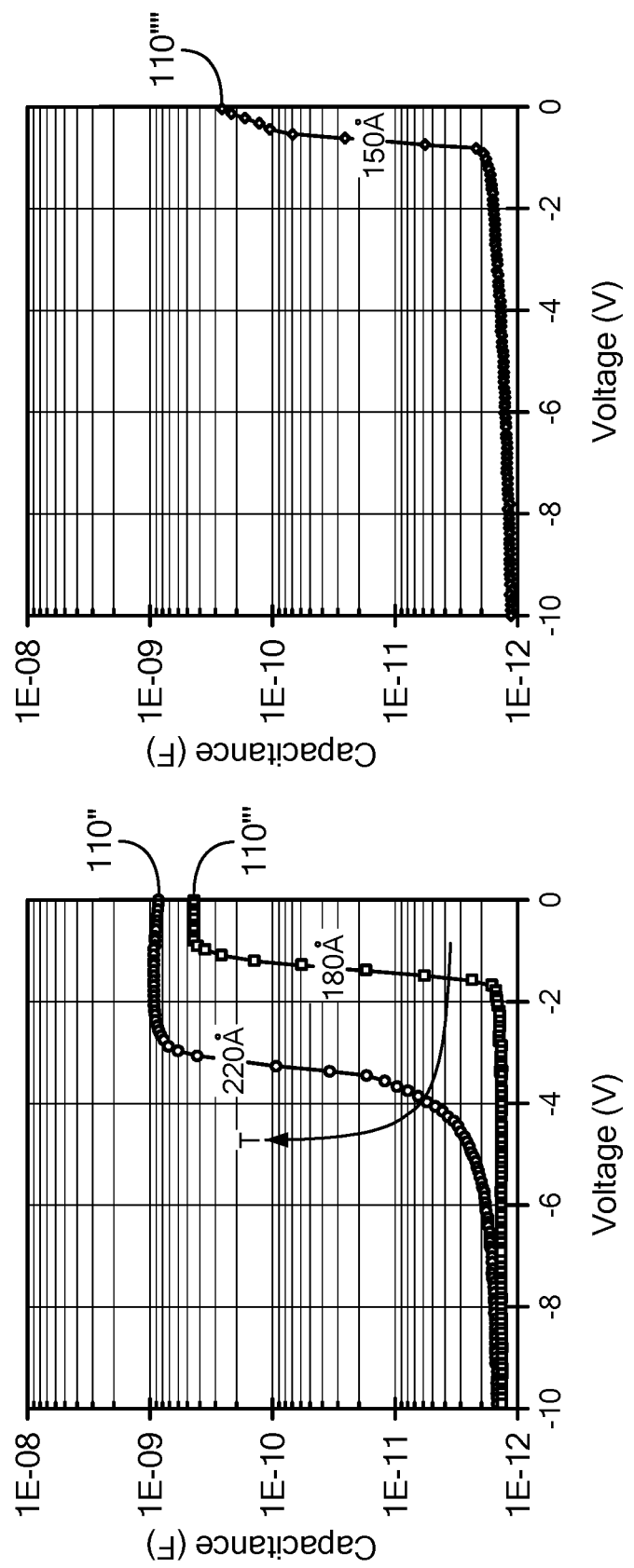
FIG. 2C
FIG. 2D

SEMICONDUCTOR STRUCTURE HAVING BOTH ENHANCEMENT MODE GROUP III-N HIGH ELECTRON MOBILITY TRANSISTORS AND DEPLETION MODE GROUP III-N HIGH ELECTRON MOBILITY TRANSISTORS

TECHNICAL FIELD

This disclosure relates generally to Group III-Nitride (Group III-N) enhancement mode (E-Mode) High Electron Mobility Transistors (HEMTs) and more particularly to semiconductor structures having both Group III-N E-Mode HEMTs and Group III-N depletion mode (D-Mode) field effect transistors (FETs) on a common crystal substrate.

BACKGROUND OF THE INVENTION

As is known in the art, Group III-N high electron mobility transistors (HEMTs) have high breakdown voltages, large electron saturation velocities, high intrinsic polarization induced two-dimensional electron gas (2DEG) channels, and large conduction band offsets. Group III-N materials in the wurtzite crystal structure exhibit spontaneous and piezoelectric polarization due in part to structural deviations from the ideal tetrahedral coordination along the (0001) axis (c-axis) and differences in the electronegativity between the bonded group III and nitrogen atoms. The Group III-N include Indium Nitride (InN), Gallium Nitride (GaN), Aluminum Nitride (AlN), Boron Nitride (BN) and all of their associated alloys including $In_x(Al_yGa_{1-y})_{1-x}N$ (where $0 \leq x \leq 1$ and $0 \leq y \leq 1$) and $B_z(In_x(Al_yGa_{1-y})_{1-x})_{1-z}N$ (where $0 \leq x \leq 1$ and $0 \leq y \leq 1$ and $0 \leq z \leq 1$); where $x+y+z=1$. More particularly, as is also know, transistors using the c-axis metal polar orientation of the Group III-N materials are typically based on AlGaN/GaN heterostructure between a lower GaN layer and upper AlGaN layer where at the GaN layer side of the AlGaN/GaN heterojunction, or interface, a 2DEG channel forms to compensate the net polarization charge created by the polarization discontinuity that exists at that heterojunction. In the AlGaN/GaN heterojunction, the AlGaN layer is generally referred to as the topside barrier layer separating the heterojunction from the gate electrode while the GaN layer serves as the 2DEG channel layer wherein mobile charge resides. Group III-N HEMTs are typically operated in depletion mode where a negative bias voltage is applied to the gate electrode relative to the source electrode to deplete carriers in the 2DEG channel below the gate electrode and turn off conduction between the source and drain electrodes; the gate electrode being disposed between an ohmic source electrode and an ohmic drain electrode.

An advantage of a Group III-N depletion mode device is that it can be readily fabricated using a three terminal device structure whereby the gate electrode is formed between an ohmic source electrode and an ohmic drain electrode. The channel below the gate region of a Group III-N depletion mode device is conductive when the source, drain, and gate electrodes are all grounded or equivalently held at the same bias condition. The voltage biases on the gate and drain electrode voltages are quoted relative to the source electrode. Therefore, when a three terminal Group III-N depletion mode device is operated under a zero bias voltage condition, an equivalent bias is applied to both the gate electrode and the source electrode such that no potential exists between the two electrodes. When the drain electrode is biased negatively with respect to the source electrode and the gate electrode is operated under zero gate bias voltage conditions in a Group III-N depletion mode device, current will flow between the source and drain electrodes due to the presence of the 2DEG channel in the structure. As the voltage at the gate electrode becomes more negative with respect to the voltage at the source electrode, the carriers under the gate electrode will start to deplete and the total current that can be transported between the source and drain electrodes will begin to decrease. The minimum gate-to-source voltage ($V_{GS}$) that is needed to create a conducting path between the source and drain electrodes is called the threshold voltage.

As is also known in the art, it is sometimes desirable to form both D-Mode and E-Mode HEMTs on the same crystal body, as in an integrated circuit chip. In one application, for example, in the event of a specific type of failure, they need a 'Fail Safe Switch' to inherently respond in a way that will cause no or minimal harm to other equipment. Further, it is important to fabricate E-mode GaN-based transistors without disturbing and sacrificing the performance of the existing D-mode GaN-based transistors. An E-mode transistor requires a threshold voltage equal to, or greater than zero on the gate electrode relative to the source electrode for current to flow between the source and the drain electrode and under the gate electrode. More particularly, there is a need to fabricate stable epitaxial gate structures for Group III-N enhancement mode fail safe switches on the same wafer as high performance RF depletion mode devices, with threshold voltages on the enhancement mode gate electrode relative to the voltage on the source electrode greater than +1 Volt. E-mode devices typically need a threshold voltage of at least +1 V to protect the circuit from noise on the gate signal and the threshold voltage needs to be stable over the operational lifetime.

E-mode AlGaN/GaN HEMTs with positive and stable threshold voltages have been reported using p-type GaN gate electrodes; see a paper by Meneghini et al., *Technology and reliability of normally-off GaN HEMTs with p-type gate*, Energies 10, 153, 2017. See also Materials Science in Semiconductor Processing 78 (2018) 96-106. *Review of technology for normally-off HEMTs with p-GaN gate* by Giuseppe Greco et al., describing the use of a Mg doped GaN gate electrode (a p-type doped GaN electrode). See also U.S. Pat. No. 7,728,356 Issued Jun. 1, 2010 Suh et al., *P-GaN/AlGaN/AN/GaN enhancement-mode field effect transistor*. These devices utilize a p-type GaN gate electrodes with a magnesium (Mg) doped GaN layer between the AlGaN barrier layer and a metal electrode. The Mg doping provides p-type conductivity in the Mg doped GaN layer that raises the conduction band at the AlGaN/GaN interface and depletes carriers from the 2DEG channel under the zero bias conditions.

However, the use of Mg to produce the p-type GaN for the gate electrode creates processing issues in many fabrication facilities because Mg contaminates many types of processing equipment that can otherwise be used for other processing steps.

As is also known in the art, beryllium doped GaN material displays insulating behavior, see K. Lee et al., *Compensation in Be-doped Gallium Nitride Grown Using Molecular Beam Epitaxy*, Material Research Society Symposium, Proc. Vol. 892 (2006). The insulating characteristics of beryllium doped GaN layers have been used to mitigate the effects of conductive buffer layers in GaN HEMTs, see D. F. Storm et al., *Reduction of buffer layer conduction near plasma-assisted molecular-beam epitaxy grown GaN/AlN interfaces by beryllium doping*, Appl. Phys. Lett., 81, 3819, 2002. Theoretical calculations of the actual ionization energy of substitutional beryllium in GaN over the years have estimated the ionization energy to be anywhere from as low as 60 meV see Bernardini et al., *Theoretical evidence for efficient p-type doping of GaN using beryllium*, arXiv:cond-mat/9610108v2, 1997, to as high as 550 meV see J. L. Lyons et al., *Impact of Group-II Acceptors on the Electrical and Optical Properties of GaN*, Jpn. J. Appl. Phys. 52, 08JJ04, 2013. Beryllium interstitials in GaN also have been calculated to have a low formation energy and to be a double donor suggesting beryllium interstitials are likely to incorporate during growth and lead to the compensation of substitutional beryllium acceptors in GaN see C. G. Van de Walle et al., *First-principles studies of beryllium doping of GaN*, Phys. Rev. B, 63, 245205, 2001. The possibility that beryllium may occupy interstitial as well as substitutional sites may be another possible reason why beryllium doping does not produce p-type conductivity.

SUMMARY OF THE INVENTION

In accordance with the present disclosure, an Enhancement-Mode HEMT is provided having a gate electrode comprising: a layer, disposed between an electrically conductive gate electrode contact and a gate region of the Enhancement-Mode HEMT, such layer comprising: a Group III-N material, the Group III-N material having a predetermined resistivity and a dopant disposed in the Group III-N material, such dopant: providing the layer with a resistivity greater than the predetermined resistivity of the Group III-N material; and depleting carriers from a 2DEG under the gate at zero gate bias.

In one embodiment, an Enhancement-Mode HEMT is provided having a gate electrode comprising: a layer, disposed between an electrically conductive gate electrode contact and a gate region of the Enhancement-Mode HEMT, such layer comprising: a Group III-N material, the Group III-N material having a predetermined resistivity and a dopant disposed in the Group III-N material, such dopant: providing the layer with a resistivity greater than the predetermined resistivity of the Group III-N material, and depleting carriers from a 2DEG under the gate when an applied gate voltage is less than a threshold voltage, and the threshold voltage is equal to, or greater than zero.

In one embodiment, the dopant is beryllium.

In one embodiment, the dopant is Molecular Beam Epitaxy beryllium.

In one embodiment the doped Group III-N material comprises GaN or AlGaN.

In one embodiment, an Enhancement-Mode HEMT structure is provided having: a crystal structure having a pair of stacked Group III-N semiconductor layers, the pair of stacked Group III-N semiconductor layers forming a heterojunction with a 2DEG channel being formed in a lower one of the pair of stacked Group III-N layers; a source electrode for supplying current to the 2DEG; a drain electrode for extracting current supplied from the 2DEG; and a gate electrode, disposed between the source electrode and the drain electrode and over a gate region of the upper one of the pair of stacked layers for controlling the supplied current passing to the drain electrode; wherein such gate electrode is disposed over the gate region. The gate electrode, comprising: an electrically conductive gate electrode contact; a doped, Group III-N material, disposed between the electrically conductive gate electrode contact and the gate region, such doped, Group III-N material increasing resistivity of the Group III-N material and provides the HEMT with a threshold voltage equal to, or greater than zero.

In one embodiment, the doped, Group III-N material forces the Fermi level in the doped Group III-N material to reside close enough to the valance band edge to raise the conduction band at the interface between the pair of stacked Group III-N semiconductor layers to deplete carriers from the 2DEG channel under the gate region at zero gate bias.

In one embodiment, the doped, Group III-N material is grown by Molecular Beam Epitaxy (MBE).

In one embodiment, the doped, Group III-N material is grown under Group III rich surface conditions by Molecular Beam Epitaxy (MBE).

In one embodiment, the gate electrode comprises a single doped, Group III-N material.

In one embodiment, the doped, Molecular Beam Epitaxy Group III-N material comprises Beryllium.

In one embodiment, an Enhancement-Mode HEMT structure is provided having a gate electrode with a doped, Group III-N material disposed between an electrically conductive gate electrode contact and a gate region of the Enhancement-Mode HEMT structure, such doped, Group III-N layer increasing resistivity of the Group III-N material and depleting the 2DEG under the gate region at zero bias.

In one embodiment, a method is provided for forming an Enhancement mode HEMT, structure having an AlGaN/GaN structure to produce a 2DEG in the GaN portion of the AlGaN/GaN structure, the method comprising: forming a gate structure for Enhancement mode HEMT structure comprising: a beryllium doped, molecular beam epitaxy layer formed under gallium-rich growth conditions to produce resistive material that shifts the band structure in an AlGaN/GaN HEMT to produce positive threshold voltages required for E-mode operation.

In one embodiment, the beryllium doped Group III-N layer is grown by MBE with a predetermined gallium to nitrogen flux ratio selected to maintain more than a monolayer of liquid gallium on the surface during the MBE growth.

In one embodiment, an Enhancement-Mode HEMT is provided having a gate electrode with a doped, Group III-N material disposed between an electrically conductive gate electrode contact and a gate region of the Enhancement-Mode HEMT, such doped, Group III-N layer increasing resistivity of the Group III-N material and depleting carriers from a 2DEG under the gate when an applied gate voltage is less than a threshold voltage, and the threshold voltage is equal to, or greater than zero.

In one embodiment, a structure, comprising: a single crystal substrate; a Depletion mode (D-mode) HEMT and an Enhancement mode (E-mode) HEMT formed on the single crystal substrate; the Enhancement-Mode HEMT having a gate electrode with a doped, Group III-N material disposed between an electrically conductive gate electrode contact and a gate region of the Enhancement-Mode HEMT, such doped, Group III-N layer increasing resistivity of the Group III-N material and depleting carriers from a 2DEG under the gate when an applied gate voltage is less than a threshold voltage, and the threshold voltage is equal to, or greater than zero.

In one embodiment, a method is provided for forming an Enhancement-Mode HEMT, comprising: forming a gate electrode comprising: a layer, disposed between an electrically conductive gate electrode contact and a gate region of the Enhancement-Mode HEMT, such layer comprising: a Group III-N material, the Group III-N material having a predetermined resistivity; and depositing by molecular beam epitaxy, a dopant in the Group III-N material, such dopant: providing the layer with a resistivity greater than the predetermined resistivity of the Group III-N material; and depleting carriers from a 2DEG under the gate at zero gate bias.

In one embodiment, a method is provided for forming an Enhancement-Mode HEMT, comprising: forming a gate electrode comprising: a layer, disposed between an electrically conductive gate electrode contact and a gate region of the Enhancement-Mode HEMT, such layer comprising: a Group III-N material, the Group III-N material having a predetermined resistivity; a depositing by molecular beam epitaxy, a dopant in the Group III-N material, such dopant: providing the layer with a resistivity greater than the predetermined resistivity of the Group III-N material, and depleting carriers from a 2DEG under the gate when an applied gate voltage is less than a threshold voltage, and the threshold voltage is equal to, or greater than zero.

The inventors, as a result of their experimentally generated data, recognized, that in spite of the teaching of Meneghini et al., and Greco et al., that p-type doped GaN (Mg) for the gate electrode (dopant that that will reduce the resistivity of the GaN) can be used to deplete carriers in the 2DEG channel under zero bias conditions; Applicant uses a more process friendly dopant, e.g., beryllium, which, while having the opposite effect on the resistivity of GaN (i.e., the beryllium, which increased the resistivity of the GaN as distinguished from Mg which reduced the resistivity of the GaN) was able to deplete carriers in the 2DEG channel under zero bias conditions.

The inventors first questioned whether the GaN for the gate electrode was required to have mobile p-type carriers, or whether it was sufficient to simply adjust the Fermi level in the GaN for the gate electrode. The inventors recognized that beryllium GaN might pin the Fermi level at an acceptor level, based on the various calculations of ionization energy (Bernardini et al., Lyons et al., and Van de Walle et al., referenced above), but likely at a higher energy level than Mg based on the lack of p-type conductivity in beryllium doped GaN. Such recognition led to the first few experiments where the inventors were able to show that beryllium doped GaN for the gate electrode could actually deplete a 2DEG in an AlGaN/GaN HEMT when grown by MBE under Ga-rich surface conditions. Prior to the experiments, the inventors did not know if beryllium doped GaN would be able to deplete an AlGaN/GaN 2DEG as there was no ability to know based on the prior art that the inventors were, and are today, aware of as to exactly where and how efficiently beryllium doped GaN would pin the bands for E-mode operation; in fact, even based on the success of the experiments the inventors still do not know exactly where the bands are pinned. Once beryllium doped GaN was shown to deplete an AlGaN/GaN 2DEG, the inventors still did not know a priori what level of threshold voltage could be realized until they processed and measured the first transistor structures. In this way, the inventors, as a result of their experimentally generated data, recognized that one does do not need p-type conductivity in GaN to alter the carrier concentration in a 2DEG as taught in the prior art described above, but rather one needs to be able to sufficiently pin the Fermi level as can be done with a resistive GaN material to alter the carrier concentration in a 2DEG and therefore use beryllium as a dopant for the GaN; the use of beryllium in GaN being a more process friendly dopant to use than Mg. More particularly, in one embodiment, the beryllium having a doping concentration of $5 \times 10^{18}/cm^3$ was experimentally found by the inventors to reduce the resistivity of the GaN from 100 Ohm-cm for undoped GaN to $2.2 \times 10^3$ Ohm-cm for the beryllium doped GaN and depletes carriers from a 2DEG under the gate at zero gate bias.

To put it still another way, the inventors have disregarded the conflicting teachings of the prior art discussed above and of which the inventors were, or are today, aware of as to where the ionization energy of beryllium doped GaN lies with respect to the valance band or whether it is highly compensated or not as in the above described publications and experimentally determined and produced E-mode HEMTs with beryllium doped GaN gates and determined that the beryllium doped GaN in the produced E-mode HEMTs did not have p-type conductivity, but rather was insulating. The inventors then realized that in a p-GaN gate E-mode GaN HEMT reported in for example Greco et al., the p-type conductivity of the doped GaN was not responsible for depleting the carriers in the 2DEG under zero bias, rather it was where the doping pinned the Fermi level with respect to the valance band of the GaN that was important. Therefore, despite the fact that beryllium doped GaN does not have p-type conductivity, and the actual Fermi pinning level of the beryllium dopant is not known to the inventors even today the inventors have, as a result of their experimentally generated data, recognized that a resistive beryllium doped GaN layer under the gate region of a GaN HEMT is an alternative material for fabricating E-mode GaN devices.

The inventors thereby also recognized that by providing a layer of GaN doped beryllium by molecular beam epitaxy under gallium-rich surface conditions produces resistive material that shifts the band structure in an AlGaN/GaN HEMT to produce positive threshold voltages required for E-mode operation. The inventors further recognized that similar E-mode operation of GaN HEMTs realized with p-type GaN under the transistor gate can still be realized if resistive GaN is used in place of the p-type GaN as long as the Fermi level is pinned close enough to the valance band edge of the resistive GaN to deplete all the carriers in the 2DEG at zero bias conditions. Metal-rich surface conditions occur during MBE growth of Group III-N when a predetermined Group III to nitrogen flux ratio is used to maintain more than a monolayer excess of the Group III elements on the surface during the growth. Metal rich surfaces typically reduce oxygen incorporation and promote smoother surfaces than nitrogen rich growth surfaces in MBE growth. Beryllium doping in GaN from $1 \times 10^{18}/cm^3$ to $1 \times 10^{19}/cm^3$ under gallium rich surface conditions is possible for E-mode applications as higher doping levels begin to create additional defects and disorder in the material and eventually lead to structural degradation around $5 \times 10^{19}/cm^3$ while doping levels below $1 \times 10^{18}/cm^3$ become inefficient at shifting the band structure to realize E-mode operation. Further, the vapor pressure of beryllium is low leading to no undesired background doping or chamber memory effects for MBE growth. Still further, the growth of beryllium doped Group III-N under the gate region by MBE also enables dual E-mode and D-mode devices to be realized on the same wafer.

Thus, the inventors, as a result of their experimentally generated data, recognized that the mobile hole carriers in Mg doped GaN are not required to make an E-mode device and they, as a result of their experimentally generated data, recognized that beryllium doping by molecular beam epitaxy under gallium-rich growth conditions produces resistive material that is capable of shifting the band structure in an AlGaN/GaN HEMT to produce positive threshold voltages required for E-mode operation. To put it another way, the inventors recognized that the benefits of the p-type GaN used under the transistor gate for E-mode structures can still be realized if resistive GaN is used in place of the p-type GaN as long as the Fermi level is pinned close enough to the valance band edge of the resistive GaN to deplete all the carriers in a 2DEG at the AlGaN/GaN interface under zero bias conditions.

Thus, the use of beryllium dopant in place of Mg doped GaN E-mode HEMTs removed the problem of having to use Mg doping to produce E-mode HEMTs with its potentially damaging effects on many types of processing equipment that can otherwise be used for other processing steps.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 2C is a structure and a set of capacitance-voltage measurements for different $Al_{0.25}Ga_{0.75}N$ layer thickness of the structure showing the relative charge in the 2DEG at the interface of an AlGaN/GaN epitaxial material structure terminated with a 500 Å beryllium doped GaN layer grown by MBE useful in understanding the E-mode HEMT of FIG. 1;

FIG. 2D is a structure and a set of capacitance-voltage measurements taken on the surface of an epitaxially grown Group III-N structure terminated with an undoped GaN layer, a 150 Å $Al_{0.25}Ga_{0.75}N$ layer, and a 150 Å beryllium doped GaN layer grown by MBE useful in understanding the E-mode HEMT of FIG. 1;

Like reference symbols in the various drawings indicate like elements.

DETAILED DESCRIPTION

Figure 1:
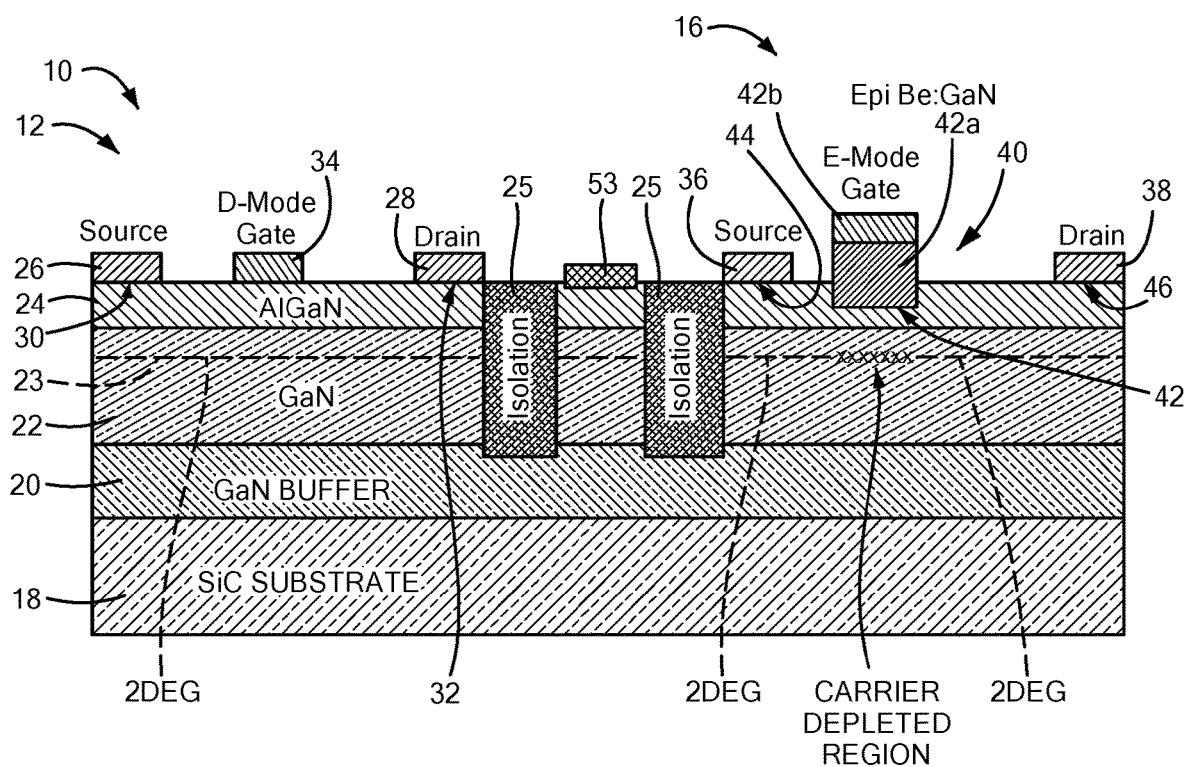
FIG. 1 is a simplified diagrammatical sketch of a structure having both a D-Mode HEMT and an E-Mode HEMT according to the disclosure.

Referring now to FIG. 1, a semiconductor structure 10 is shown having a depletion mode (D-mode) field effect transistor 12, here a D-mode HEMT, disposed in one portion of the semiconductor structure 10, and an enhancement mode (E-mode) field effect transistor 16, here a E-mode HEMT, disposed on another portion of the semiconductor structure 10 structure laterally positioned adjacent to the depletion mode field effect transistor 12, as shown. The depletion mode (D-mode) field effect transistor 12 and the enhancement mode (E-mode) field effect transistor 16 are isolated by an isolation region 25, here either an etched region separating the two sections into as mesas or by ion implanted particles.

The D-mode HEMT 12 includes a source electrode 26, a drain electrode 28 and a gate electrode 34 disposed between the source electrode 26 and the drain electrode 28, as shown. The E-mode HEMT 16 includes a source electrode 36, a drain electrode 38, and a gate electrode 40 disposed between the source electrode 36 and the drain electrode 38, as shown.

Figures 2A, 2B:
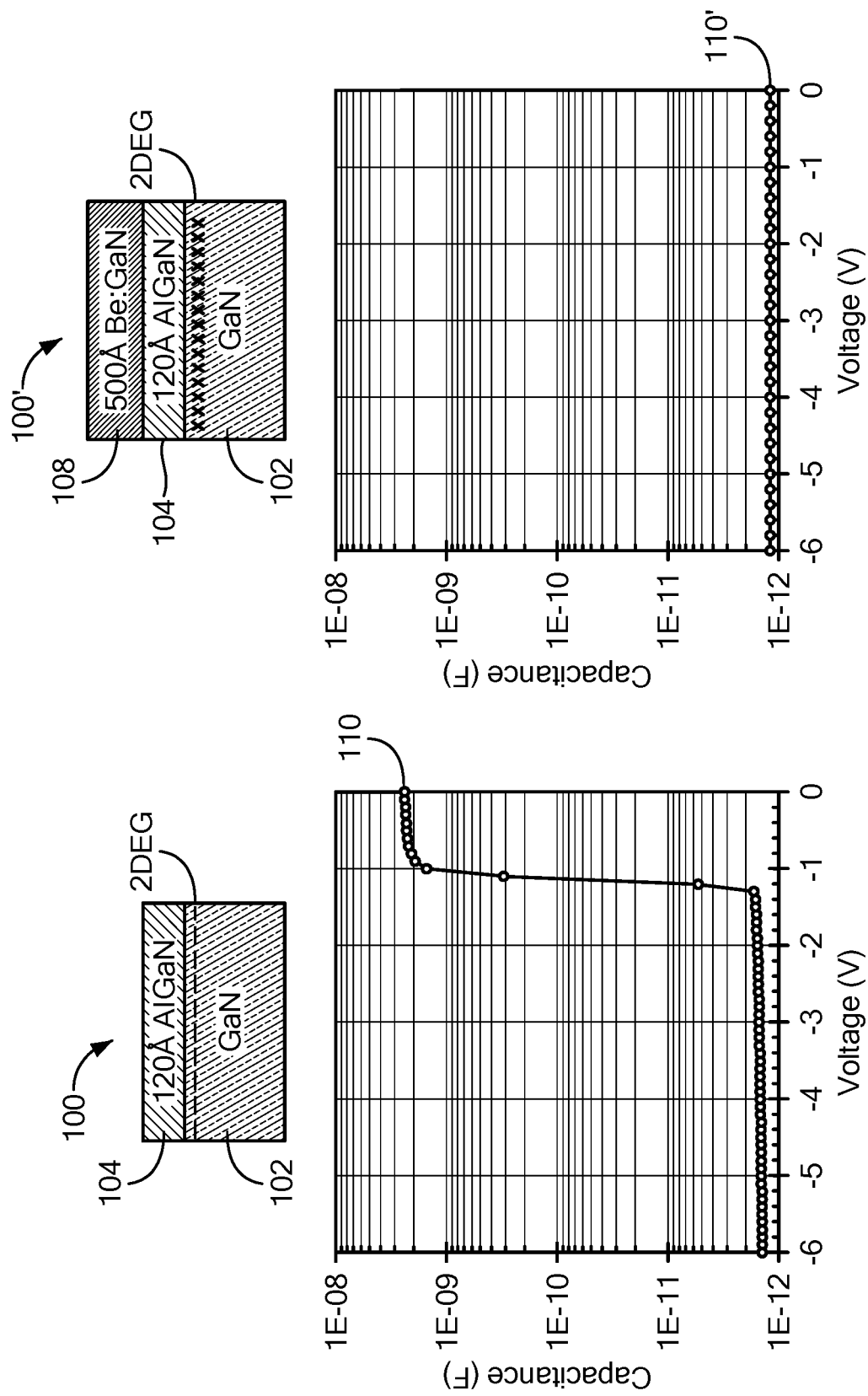
FIG. 2A is a structure without beryllium doped GaN and a plot of capacitance versus voltage of the structure showing the relative charge in a 2DEG of the structure useful in understanding the E-mode HEMT of FIG. 1.
FIG. 2B is a structure with a 500 Å beryllium doped GaN layer and a plot of capacitance versus voltage of the structure showing the relative charge in a 2DEG of the structure useful in understanding the E-mode HEMT of FIG. 1.

More particularly, the semiconductor structure 10 includes a single crystal substrate 18, here for example Silicon Carbide (SiC), and an epitaxially grown Group III-N structure, here a pair of stacked, epitaxially grown Group III-N structure semiconductor layers 20, 22, 24; layer 20 being one or more epitaxial grown Group III-N materials forming nucleation and buffer regions of a HEMT structure, layer 22 being epitaxially grown undoped Group III-N channel materials with lower resistivity than the layer 20 materials, here for example GaN, and layer 24 being epitaxially grown Group III-N barrier material, here for example AlGaN, forming a heterojunction with 2DEG channel (indicated by dotted line 23) in the GaN layer 22. It is noted that the layers 18, 20, 22 and 24 extend laterally under both the D-mode HEMT 12 and the E-Mode HEMT 16; however, as will be described in more detail below, the portion of the 2DEG under the gate electrode 40 of the E-mode HEMT 16 will be depleted of carriers under a zero bias condition on the E-mode HEMT gate electrode 40. The gate electrode 40 includes a beryllium doped GaN layer 42a in direct contact with a gate region 42 of the AlGaN layer 24 and an electrically conductive gate contact 42b in direct contact with the beryllium doped GaN layer 42a. Here, an electrically conductive gate contact 42b is formed as a sequence of metal depositions to form a Schottky contact to the Beryllium doped GaN layer 42a More particularly, referring to FIG. 2A, a structure 100 is shown in the upper portion of FIG. 2A having a GaN channel layer 102, and an AlGaN layer 104, here 120 Å thick, forming a heterojunction structure with a 2DEG being produced in the GaN layer 102, as shown. The lower portion of FIG. 2A is a plot of capacitance measurements of the structure 100 obtained from a mercury probe capacitance-voltage (Hg CV) measurement tool taken on the surface of the epitaxially grown Group III-N structure 100 terminated with the GaN layer 102 being undoped and the AlGaN layer 104 being 120 Å thick $Al_{0.25}Ga_{0.75}N$. Polarization differences between the GaN layer 102 and the AlGaN layer 104 resulted in the accumulation of electrons near the interface of the two layers 102, 104 and the formation of a 2DEG, as indicated. The Hg CV plot shown in the bottom portion of FIG. 2A was obtained by placing two Hg metal contacts on the upper surface of the AlGaN layer 104, one of the contacts being a small circular dot and the second contact being a much larger ring that surrounds the majority of the periphery of the small contact, and electrically insulated from, the smaller contact, as shown in FIG. 2F. A negative direct current (DC) voltage was applied to the small contact and the larger ring contact was kept at ground. At zero applied DC bias, the measured capacitance (C) at zero volts can be modeled as a parallel plate capacitor with the contact area defined by the Hg dot size and the separation determined by the location of the 2DEG below the upper surface of the AlGaN layer 104. As the magnitude of the negative DC voltage increases, the carriers in the 2DEG begin to deplete until a threshold voltage $V_{TH}$ is reached, the 2DEG is fully depleted, and the capacitance drops by several orders of magnitude. The total charge in the 2DEG in the GaN layer 102 was measured qualitatively by calculating the area under the curve 110, which to a rough approximation is equal to the zero-volt capacitance multiplied by threshold voltage $V_{TH}$. If the area of the Hg dot contact is well known, the actual charge can be calculated from the area under the curve 110, although in practice Hall Effect measurements are typically used for quoting sheet densities. For the structure 100, a charge density of $6.6 \times 10^{12}/cm^2$ was obtained from a contactless Hall Effect measurement with a sheet resistivity of 500 Ω/sq.

As an example of how effective the beryllium doped GaN is in depleting the 2DEG charge, a 500 Å layer of beryllium doped GaN 108 (FIG. 2B) was grown on the surface of the AlGaN layer 104. Structure 100 (FIG. 2A) and structure 100' (FIG. 2B) were separate growths with all of the respective layers being deposited at one time in an MBE reactor without any interruption at the layer interfaces. The beryllium, gallium, and aluminum were all deposited from effusion cells and the nitrogen was supplied from a commercial RF plasma source. The growth temperature for the beryllium doped GaN layer 108 (FIG. 1B) was typically between 725° C. and 750° C. Beryllium was simultaneously deposited with the gallium and nitrogen sources at a GaN growth rate of around 1 Å/sec. The doping density of the beryllium was targeted at $6 \times 10^{18}/cm^3$ as determined by prior secondary ion mass spectroscopy calibrations of the growth system. The group III to group V flux ratio was kept group III rich so that the layer was formed in a metal rich growth regime with excess gallium on the surface. At the end of the growth the excess Ga was thermally desorbed from the surface.

Attempts to capture a Hg probe CV measurement plot, shown in the lower portion of FIG. 2B, on the surface of structure 100' resulted in no measurable capacitance values above the background noise of an Inductance-Capacitance-Resistance (LCR) meter, as shown by the curve 110', including the zero volt capacitance measurement. The inability to measure a CV trace is consistent with the measurement of a sample without a 2DEG indicating the 2DEG in structure 100' is fully depleted of carriers with the addition of the 500 Å beryllium doped GaN layer 108 grown by MBE. The Hg probe CV measurement cannot be used to measure a positive threshold voltage as only the area under the Hg dot contact is conductive at a positive DC voltage, but the measurement does identify when the threshold voltage of a HEMT structure is greater than zero. A sheet resistivity greater than 40,000 f/sq. was measured for the structure 100' by a Lehighton sheet resistivity wafer mapping tool, Lehighton Electronics, Inc. Lehighton, Pa. 18235-0328 and contactless Hall Effect measurements could not be obtained for the structure 100' due to the high sheet resistivity.

FIG. 2C shows, in the lower portion of FIG. 2C, a set of capacitance-voltage measurements 110'' 110''' for different $Al_{0.25}Ga_{0.75}N$ layer 104 thickness (T) showing the relative charge in the 2DEG at the interface of an AlGaN/GaN epitaxial material structure 100'' shown in upper portion of FIG. 2C terminated with a 500 Å beryllium doped GaN layer 108'' grown by MBE. When the AlGaN layer 104 is grown 220 Å thick, there is considerable charge remaining in the 2DEG despite the addition of the 500 Å beryllium doped GaN layer 108'' as seen by the area remaining under the CV curve 110'' and a measurable sheet resistivity of 1,900 Ω/sq. When the thickness of the AlGaN layer 104 is reduced to 180 Å, the area under the corresponding CV curve 110''' is likewise reduced and the sheet resistivity increases to 9,100 Ω/sq. When the thickness of the AlGaN layer 104 is reduced to 150 Å or thinner no measurable capacitance values above the background noise of the LCR meter can be detected and sheet resistivity measurements of over 40,000 Ω/sq. are measured indicating the 2DEG is fully depleted for these AlGaN layer 104 thicknesses. FIG. 2C illustrates there is a limit to the amount of charge that can be depleted from the 2DEG using a beryllium doped GaN layer and that an $Al_{0.25}Ga_{0.75}N$ thickness of less than 180 Å is required to produce a positive threshold voltage required for use in an enhancement mode device.

FIG. 2D, shows, in the lower portion of FIG. 2D, a capacitance-voltage measurement taken on the surface of an epitaxially grown Group III-N structure 100''' shown in the upper portion of FIG. 2D terminated with an undoped GaN layer 102, a 150 Å $Al_{0.25}Ga_{0.75}N$ layer 104, and a 150 Å beryllium doped GaN layer 108''' grown by MBE. The doping density of the beryllium was targeted at $6 \times 10^{18}/cm^3$ as determined by prior secondary ion mass spectroscopy calibrations of the growth system. The group III to group V flux ratio was kept group M rich so that the layer was formed in a metal rich growth regime with excess gallium on the surface. At the end of the growth the excess Ga was thermally desorbed from the surface. The negative threshold voltage and area under the CV curve 110'''' indicates that the 150 Å beryllium doped GaN layer 108'''' is not sufficient to fully deplete the carriers from the 2DEG. Increasing the thickness of the beryllium doped GaN layer 108'''' to 250 Å is sufficient to fully deplete all of the carriers in the 2DEG and no measurable capacitance values above the background noise of the LCR meter can be detected using the Hg probe CV tool. The transition from negative to positive threshold voltages occurs when the beryllium doped GaN layer 108''' is somewhere between 150 Å and 250 Å at a beryllium doping level of $6\times10^{18}/cm^3$. Additional structures were grown with the beryllium doped GaN layer 108''' as thick as 350 Å and 500 Å with no measurable capacitance values above the background noise of the LCR meter detected using the Hg probe CV tool.

The beryllium doped GaN layer grown under metal rich surface conditions appears to be efficient at pinning the Fermi level near the valance band as only $6\times10^{18}$ Be atoms/$cm^3$ is required in a 250 Å GaN layer to lift the conduction bands of the 2DEG above the Fermi level.

Figure 2E:
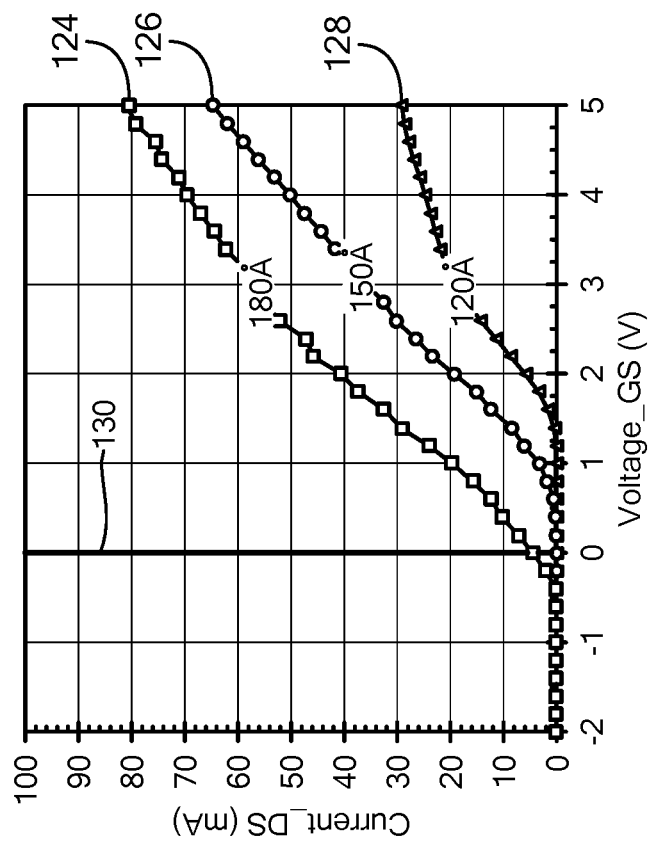
FIG. 2E is a schematic of a three terminal AlGaN/GaN HEMT having a GaN channel layer, an $Al_{0.25}Ga_{0.75}N$ layer, ohmic contact pads for source and drain electrodes, a Schottky gate metal contact, and a 500 Å beryllium doped GaN layer located directly below the gate metal and in direct contact with the AlGaN layer; and a plot of the source-to-drain current versus gate-to-source voltage of the three terminal AlGaN/GaN HEMT for different $Al_{0.25}Ga_{0.75}N$ layer thicknesses useful in understanding the E-mode HEMT of FIG. 1.
Figure 2F:
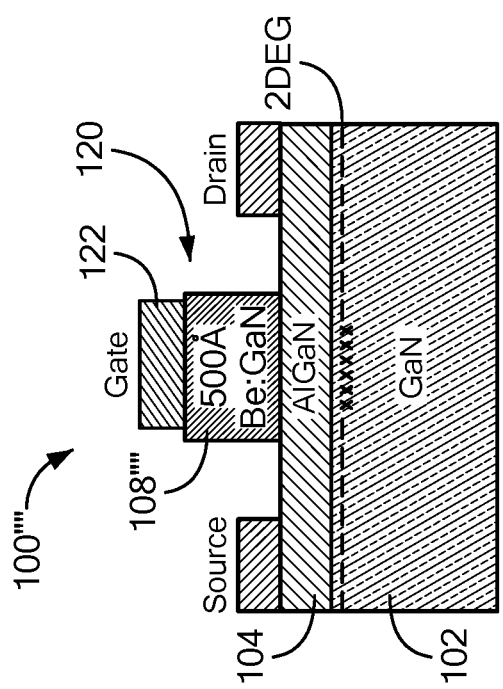
FIG. 2F is a sketch of a plan view of a mercury probe contact geometry used to generate the plots in FIGS. 2A-2E.
Figure 2F:
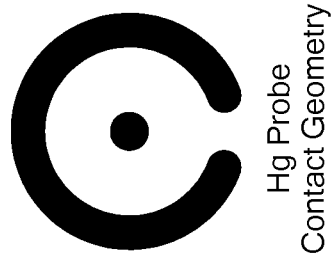

FIG. 2E, shows, in the left portion of FIG. 2E, a schematic of a three terminal AlGaN/GaN HEMT 100'''' having a 2DEG in the GaN layer 102, an $Al_{0.25}Ga_{0.75}N$ layer 104, ohmic contacts for source and drain electrodes, a gate electrode 120 having a Schottky gate metal contact 122, and a 500 Å beryllium doped GaN layer 108'''' located directly below the gate metal contact and in direct contact with the AlGaN layer 104. Three different versions of the HEMT 100'''' were fabricated with each version having a different thickness for the $Al_{0.25}Ga_{0.75}N$ layer 104. The fabrication started with three blanket epi growths of the Group III-N material layers in an MBE system. The growths all included an undoped GaN channel layer 102, an AlGaN barrier layer 104, and a beryllium doped GaN layer 108'''' grown under metal rich surface conditions. At the conclusion of each growth the excess Ga was thermally desorbed from the surface. The GaN growth rate was around 1 Å/sec for all three layers and the doping density of the beryllium doped GaN layer 108'''' was targeted at $6\times10^{18}/cm^3$ for each growth as determined by prior secondary ion mass spectroscopy calibrations of the growth system. The only difference in the three growths was the length of time the AlGaN layer 104 was grown. The resulting thickness of the AlGaN layer 104 for the three growths was 180 Å, 150 Å, and 120 Å, see the left side portion of FIG. 2E.

The processing used to form the device 100'''' was identical for all three wafers. The gate electrode structure 120 was lithographically patterned on the wafer and the beryllium doped GaN layer 108'''' was removed from the wafers using a plasma etch process except for the regions located directly under where the gate metal 122 was to be deposited. A mesa isolation etch was performed to isolate different devices. Ohmic metal contacts were then patterned, deposited, and annealed followed by the deposition of the gate metal 122 on the areas of the beryllium doped GaN layer 108'''' that were not etched. The right side portion of FIG. 2E shows a plot of source-drain current versus applied gate voltage from three terminal devices measured on each of the three wafers. The devices were single finger gate transistors with 250 micron gate widths and measured with 10V applied across the source and drain electrodes. The source-drain current 124 as a function of gate voltage for the device fabricated from the growth with the 180 Å AlGaN layer 104 shows that the source-drain current 124 begins to increase above zero at around −0.2V on the gate demonstrating weak depletion mode operation. A zero gate voltage position 130 on the plot is indicated by a vertical line 130. A source-drain current 126 as a function of gate voltage for the device fabricated from the growth with the 150 Å AlGaN layer 104 shows that the source-drain current 126 begins to increase above zero at around +0.9V on the gate demonstrating E-mode operation. A source-drain current 128 as a function of gate voltage for the device fabricated from the growth with the 120 Å AlGaN layer 104 shows that the source-drain current 128 begins to increase above zero at around +1.6V on the gate demonstrating E-mode operation well in excess of 1.0V with the use of the MBE grown beryllium doped GaN layer 108''''.

For the integration of the E-mode HEMT with D-mode devices on the same wafer, it is important that the beryllium doped GaN layers 108 can be regrown on an AlGaN layer 104 after a series of processing steps and still provide positive threshold voltages. To demonstrate this point, a 120 Å $Al_{0.25}Ga_{0.75}N/GaN$ structure was grown by MBE, removed the structure from vacuum, patterned photoresist on the surface of the AlGaN layer 104, stripped the photoresist off the AlGaN layer 104, cleaned the surface of the AlGaN layer 104 for 30 seconds with 1 HF:100 $H_2O$ followed by 1 minute with 1 HCl:10 $H_2O$, placed the structure back into the MBE system, heated the sample to 760° C., performed a series of Ga cleans, lowered the temperature to between 725° C. and 750° C., and grown a 500 Å layer of $6\times10^{18}/cm^3$ beryllium doped GaN under Ga-rich surface conditions on the AlGaN layer 104. The excess Ga on the surface was removed by thermal desorption and the structure was cooled and removed from vacuum. Hg probe CV measurements of the regrown structure show no measurable capacitance values above the background noise of the LCR meter, indicating a positive threshold voltage for a structure with regrown beryllium doped GaN is achievable.

Referring again to FIG. 1, and considering first the D-Mode HEMT 12 (FIG. 1), source and drain electrode 26, 28 thereof are formed in ohmic contact to the GaN channel layer 22 with source and drain contact regions 30, 32, respectively of the AlGaN layer 24. The D-Mode HEMT 12 is here formed using any conventional processing to provide a D-Mode HEMT having any desired electrical characteristic. It is noted that the AlGaN layer 24 is on, and in direct contact with the GaN layer 22 to form the 2DEG channel for a flow of carriers passing laterally through the GaN channel layer indicated by the dotted line 23 in the GaN channel layer 22 between the source region 30 of the AlGaN layer 24 the drain region 32 of the AlGaN layer 24 of the depletion mode field effect transistor 12, such flow of carriers being controlled by the gate 34 disposed on the AlGaN layer 24 of the depletion mode field effect transistor 12 between the source region 30 and the drain region 32.

The E-Mode HEMT 16 includes: source and drain electrode 36, 38, formed in ohmic contact to the GaN channel layer 22 with source and drain contact regions 44, 46, respectively of the AlGaN layer 24; and a gate electrode 40 with a Schottky metal contact 42b in contact with a beryllium doped GaN layer 42a in direct contact with the AlGaN layer 24, the GaN gate contact region 42 having a lower bottom portion 42a extending into an upper portion of the AlGaN layer 24 and an upper portion 42a extending above the upper portion of the of the AlGaN layer 24, as shown.

The D-Mode HEMT 12 and E-mode HEMT 16 are electrically isolated from one another by ion implantation or etched regions surrounding each structure. The semiconductor structure 10 also may include alignment markers 53, as shown, to assist with processing.

Referring now to FIGS. 3A-3F, a semiconductor structure having the single crystal substrate 18, semiconductor buffer layer 20, and the pair of stacked semiconductor layers 22, 24, is provided, as shown in FIG. 1A, Next, the mask alignment marker 53, here, for example a refractory metal marker, is formed on the surface of the structure. The mask alignment marker 53 has been placed between the regions where the D-mode HEMT 12 and the E-Mode HEMT are to be formed, as shown FIG. 3B, but the actual location of alignment markers can be anywhere within a reticle or placed as needed across a wafer.

Figure 3A:
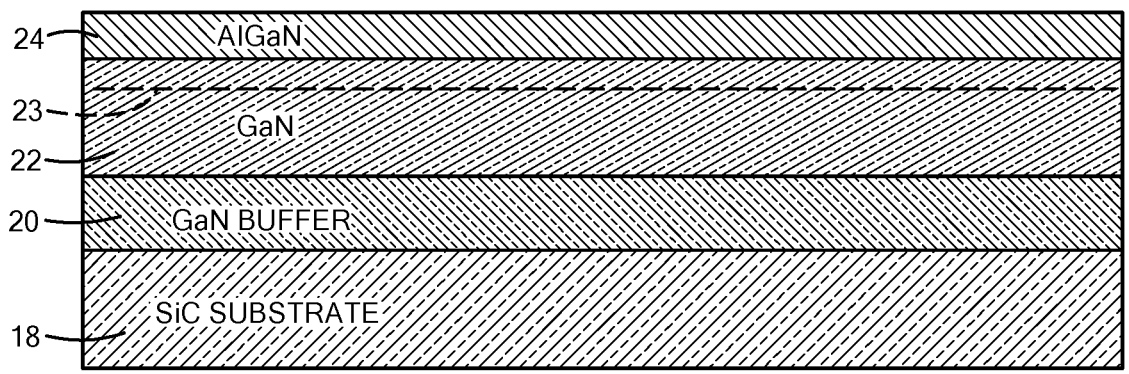
FIGS. 3A-3F are simplified diagrammatical sketches of the structure of FIG. 1 having both a D-Mode HEMT and an E-Mode HEMT of FIG. 1 at various stages in the manufacture thereof according to the disclosure.
Figure 3B:
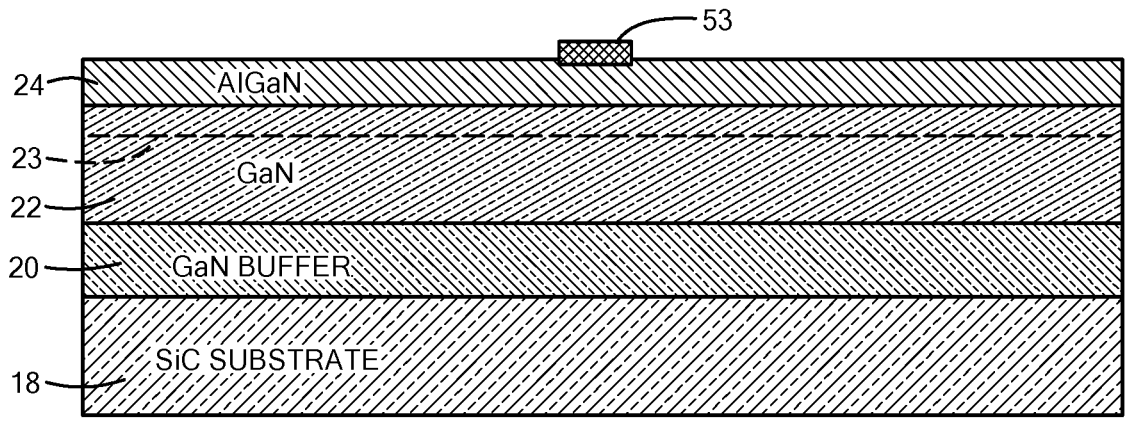
Figure 3C:
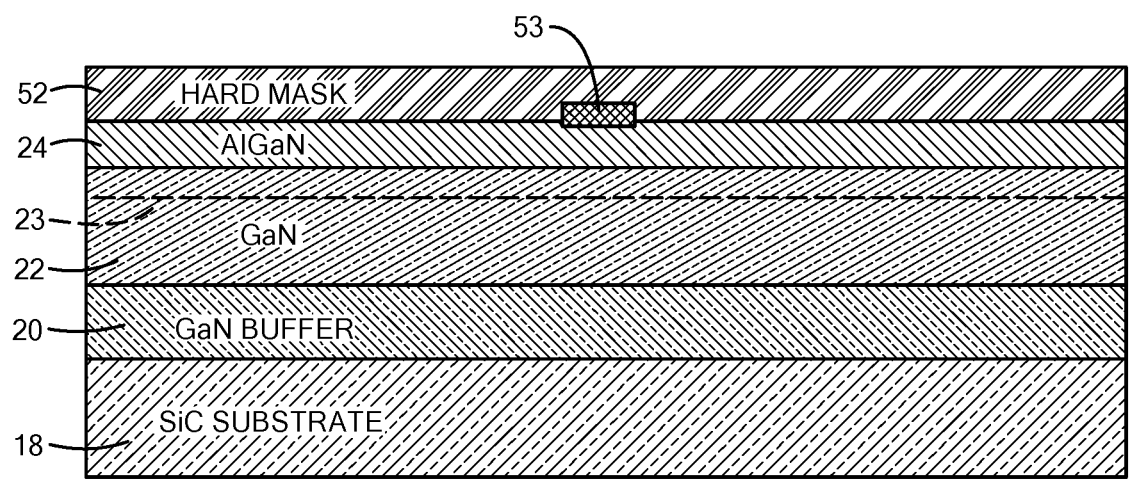

Next, and referring to FIG. 3C, a hard mask 52, more particularly, a mask of a non-reactive material, for example, a dielectric such as $SiN_x$, $Al_2O_3$, $SiO_2$ or stable metal or stacked combination that is non-reactive to the underlying AlGaN layer 24 at a temperature of a subsequent MBE process at, for example, 700° C. For example, Al or Ti would react at 700° C. and degrade if not completely eliminate the 2DEG 23 under the Al or Ti, whereas $SiN_x$ or $SiO_2$ will not alter the 2DEG 23 under the $SiN_x$ or $SiO_2$ by more 10% at MBE growth temperatures.

Figure 3D:
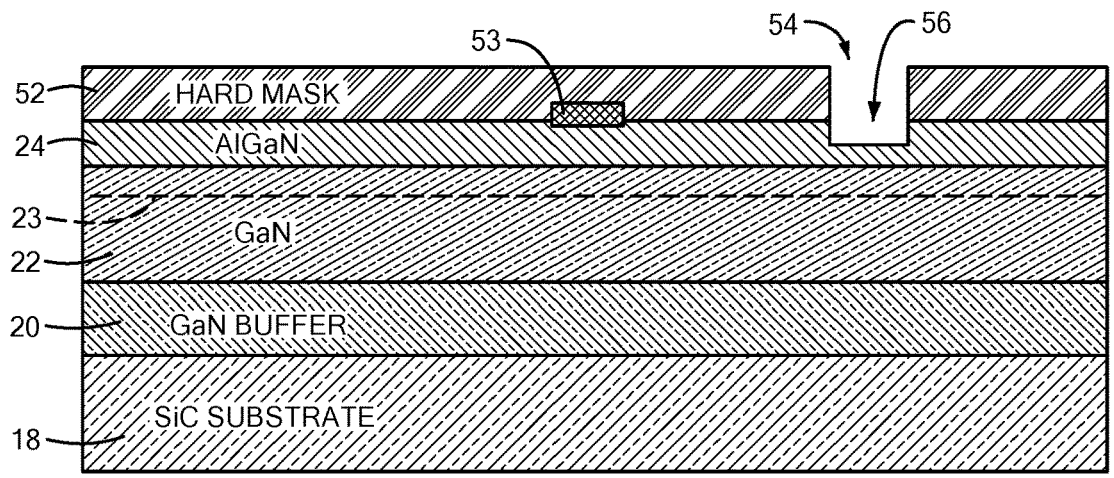

Next, and referring to FIG. 3D, the hard mask 52 is lithography patterned to have a window 54 formed therein region where the gate electrode region 42 (FIG. 1) of the E-mode HEMT gate electrode 40 is to be formed. The masked surface of the AlGaN layer 24 is etched by a dry plasma etch process to form a recessed gate trench 56 in the upper portion of the AlGaN layer 24 so that only 50 Å to 180 Å of the AlGaN layer 24 remains, which is typically 250 Å thick prior to the etch.

Figure 3E:
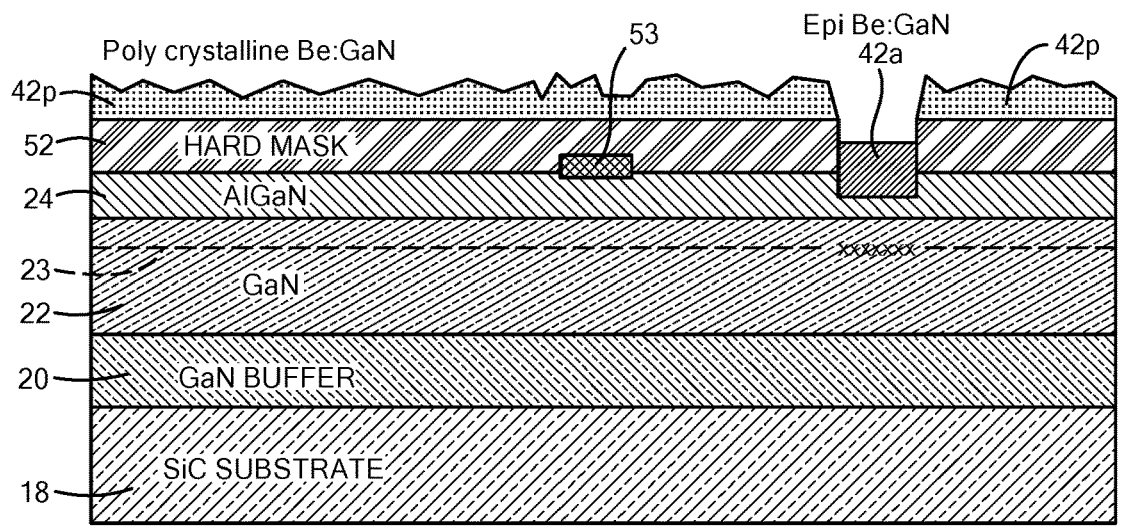

Next, referring to FIG. 3E, a doped Group III-N material is deposited on and through the openings in the patterned hard mask layer 52. Here, the Group III-N material is GaN and the dopant is beryllium. Here for example 250A to 500 Å of beryllium doped GaN (Be:GaN) is deposited using molecular beam epitaxy equipment, thereby deposing a polycrystalline Be:GaN material 42p on the upper surface of the hard mask 52 and forming the single crystal, epitaxial grown Be:GaN gate electrode layer 42a in the patterned window 54, as shown.

Here, in this embodiment, the beryllium had a doping concentration of $5\times10^{18}/cm^3$ in the GaN and was experimentally found by the inventors to reduce the resistivity of the GaN from 100 Ohm-cm for undoped GaN to $2.2\times10^3$ Ohm-cm for the beryllium doped GaN. Further, the Be:GaN material 42a depletes carriers from a 2DEG under the gate region 42 at zero gate bias as denoted by the removal of the dashes in the depiction of the 2DEG 23 in FIG. 3E.

Figure 3F:
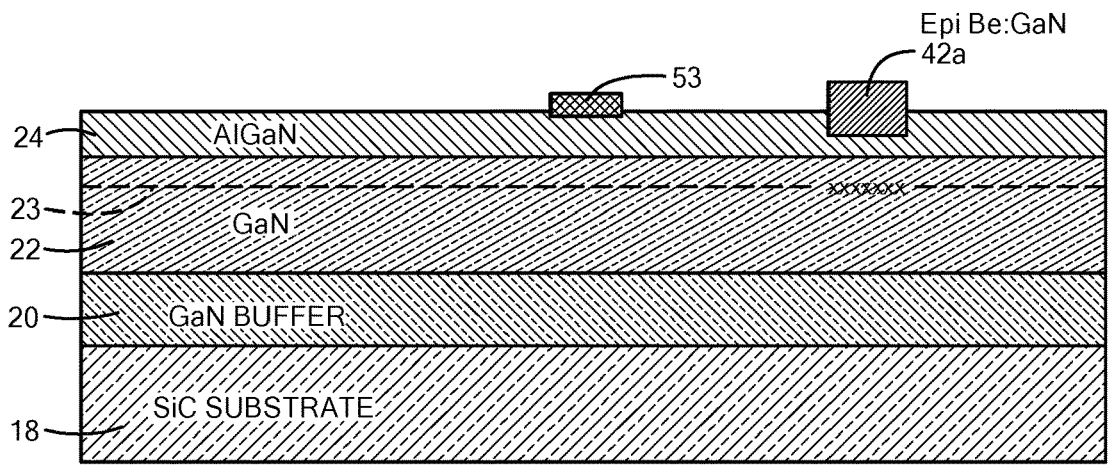

Next, and referring to FIG. 3F, the hard mask 52 is lifted off along with the deposited polycrystalline Be:GaN material 42p leaving the single crystal, epitaxial grown Be:GaN gate region 42a in the window 54 and in the recessed gate trench 56, as shown.

Having formed the epitaxial Be:GaN gate region 42, the D-Mode HEMT 12 (FIG. 1) and E-mode HEMT 16 are completed using any conventional processes.

Figure 4:
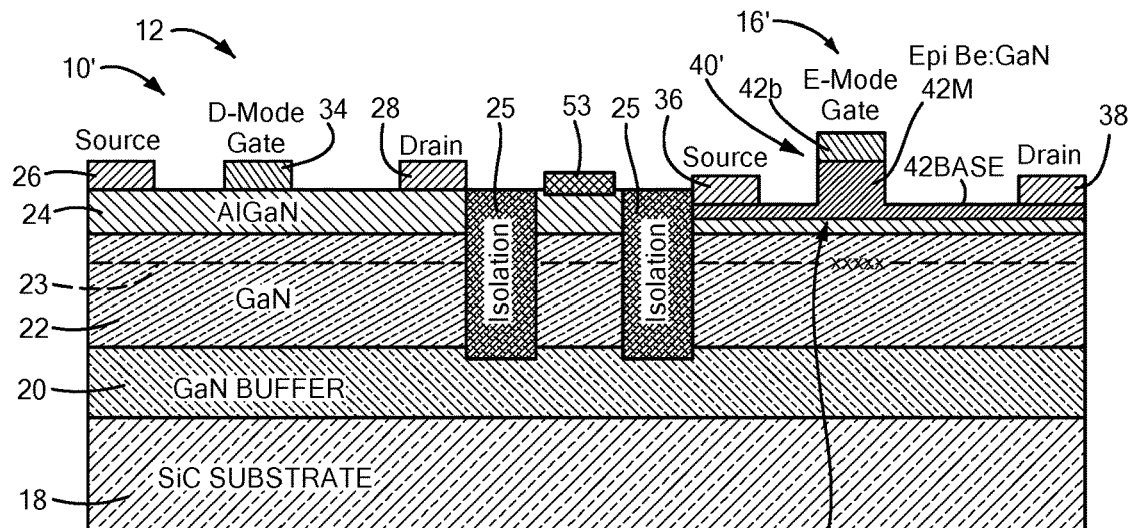
FIG. 4 is a simplified diagrammatical sketch of a structure having both a D-Mode HEMT and an E-Mode HEMT according to an alternative embodiment of the disclosure.
Figure 4A:
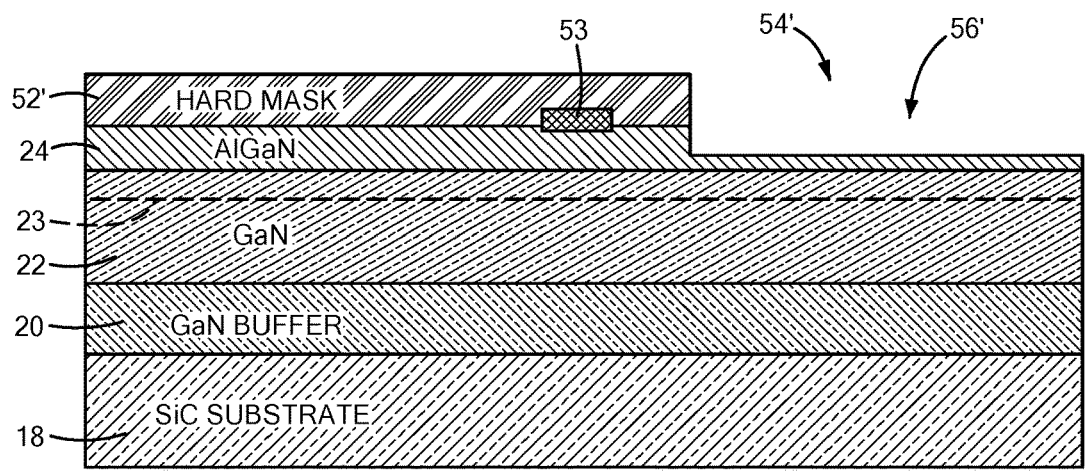
FIGS. 4A-4D are simplified diagrammatical sketches of the structure of FIG. 4 having both a D-Mode HEMT and an E-Mode HEMT of FIG. 4 at various stages in the manufacture thereof according to an alternative embodiment of the disclosure.

Referring now to FIG. 4 a simplified diagrammatical sketch of a semiconductor structure 10' having both the D-Mode HEMT 12 and an E-Mode HEMT 16' according to an alternative embodiment is shown. Here, after forming the structure shown, and described above in connection with FIG. 3C a hard mask 52' is lithography patterned to have a window 54' formed therein region where the E-mode HEMT 16' is to be formed. The surface of the exposed AlGaN layer 24 underneath the dry mask window 54' is partially etched using a dry plasma etching process so that only 50 Å to 180 Å of the AlGaN layer 24 remains in an AlGaN recess region 56' after etching (FIG. 4A). The AlGaN layer 24 is typically around 250 Å thick prior to the etching of the layer for the fabrication of the D-Mode HEMT 12 and the thickness of the AlGaN layer 24 must be reduced to below 180 Å in the region where E-mode HEMT 16' is to be formed to produce a positive threshold voltage.

Figure 4B:
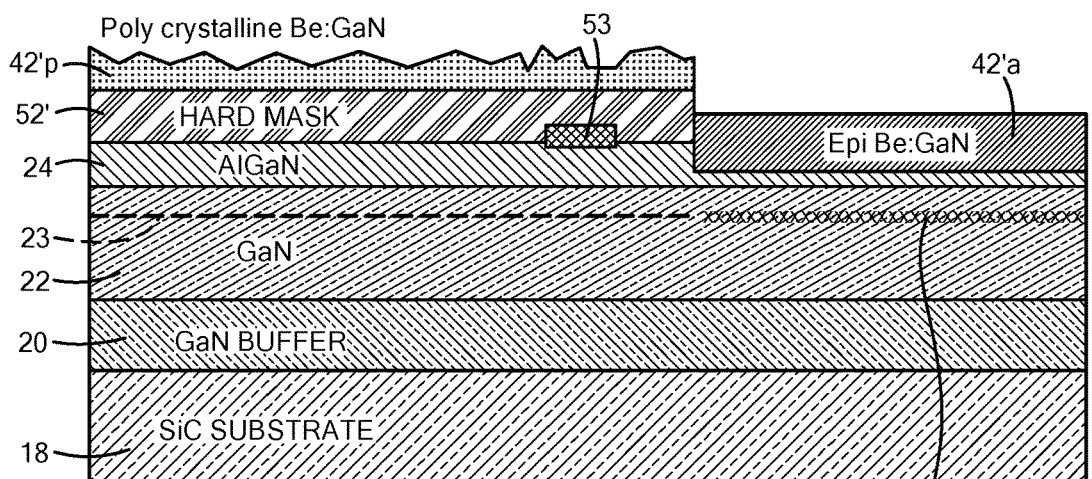

Next, referring to FIG. 4B, a doped Group III-N material is deposited on and through the openings in the patterned hard mask layer 52'. Here for example 250A to 500 Å of beryllium doped GaN (Be:GaN) is deposited using molecular beam epitaxy equipment, thereby deposing a polycrystalline Be:GaN material 42'p on the upper surface of the hard mask 52' and forming the single crystal, epitaxial grown Be:GaN gate electrode layer 42'a in the patterned window 54', as shown. The Be:GaN material 42'a depletes carriers from a 2DEG underneath the Be:GaN material 42' at zero gate bias as denoted by the removal of the dashes in the depiction of the 2DEG 23 in FIG. 4B.

Figure 4C:
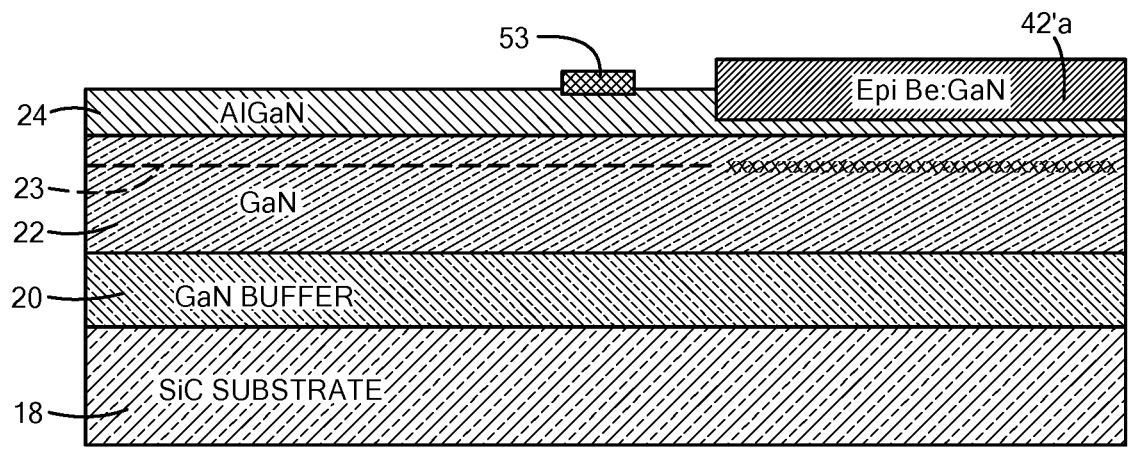

Next, and referring to FIG. 4C, the hard mask 52' is lifted off along with the deposited polycrystalline Be:GaN material 42'p leaving the epitaxial Be:GaN material 42'a in the AlGaN recess region 56', as shown.

Figure 4D:
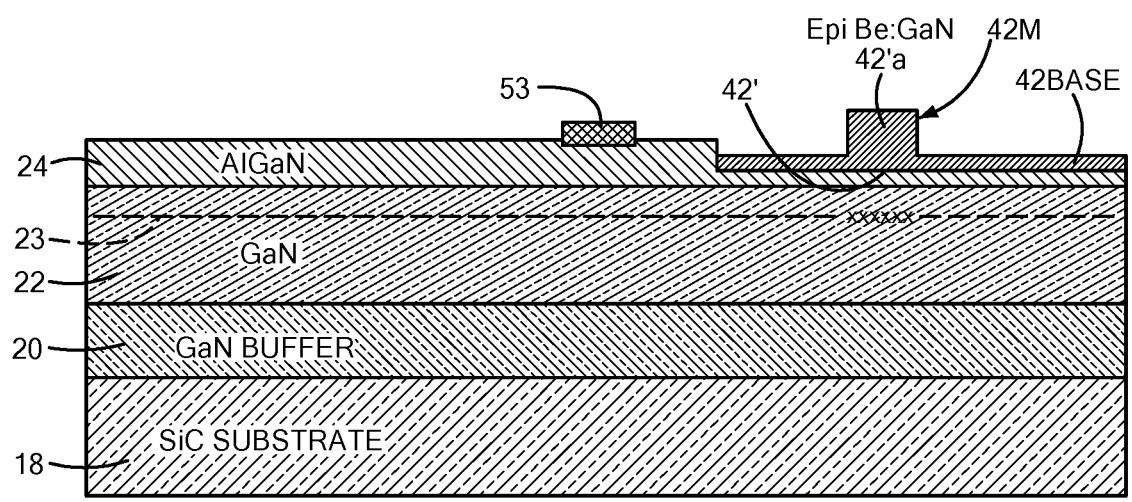

Next, and referring to FIG. 4D, the epitaxial Be:GaN material 42'a in the AlGaN recess region 56' is patterned lithographically and etched, here for example using a dry plasma etching process, to form a structure having a lower base portion 42BASE and a thicker, vertically projecting, mesa shaped, portion 42M, over where the epitaxial Be:GaN gate region 42' is to be formed, as shown. The thickness of the Be:GaN material 42'a in the base portion 42BASE should be nominally as close to 0 Å as possible without etching the AlGaN layer 24 below the base portion 42BASE. Etching into the AlGaN layer 24 below the base portion 42BASE will reduce the total current that can be passed in the source and drain access regions of the E-Mode HEMT 16'.

Referring now to FIG. 4, the D-Mode HEMT 12 (FIG. 1) and E-mode HEMT 16 are completed using any conventional processes; here however, the source and drain electrodes of the E-mode HEMT 16' are formed on the Be:GaN base portion 42BASE and in ohmic contact with the GaN channel layer 22 while the gate electrode 40' is formed with a Schottky metal contact 42b in direct contact with the vertically projecting, mesa shaped, epitaxial doped Be:GaN portion 42M.

Figure 5:
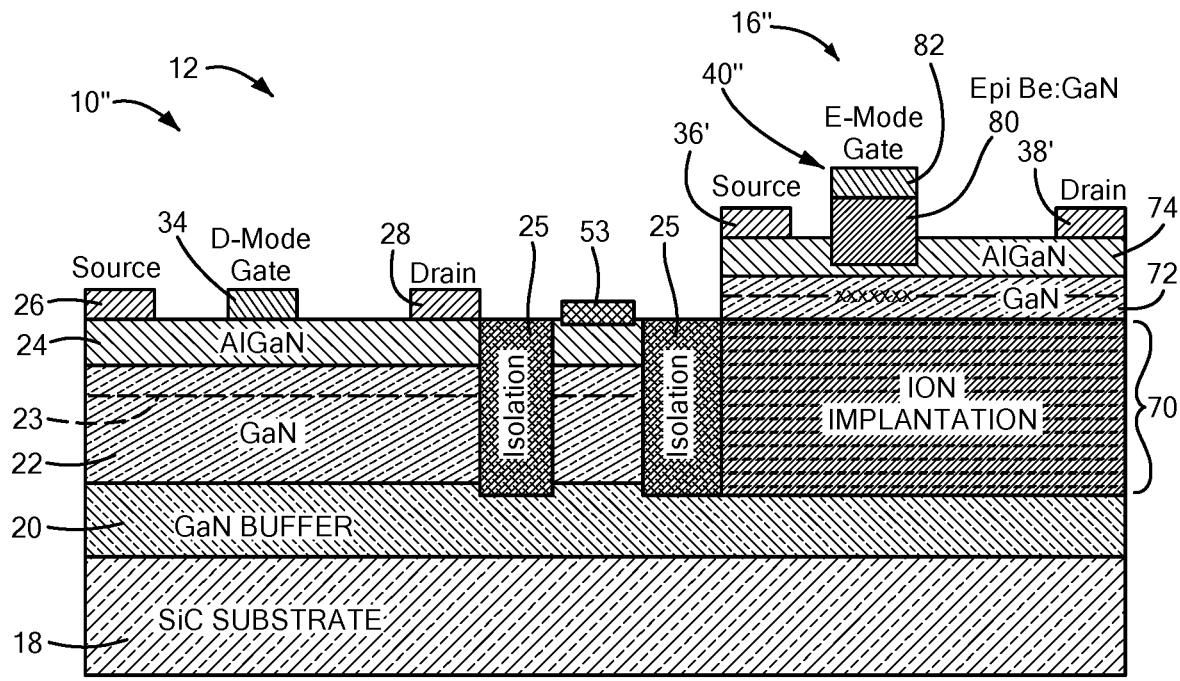
FIG. 5 is a simplified diagrammatical sketch of a structure having both a D-Mode HEMT and an E-Mode HEMT according to an alternative embodiment of the disclosure.
Figure 5A:
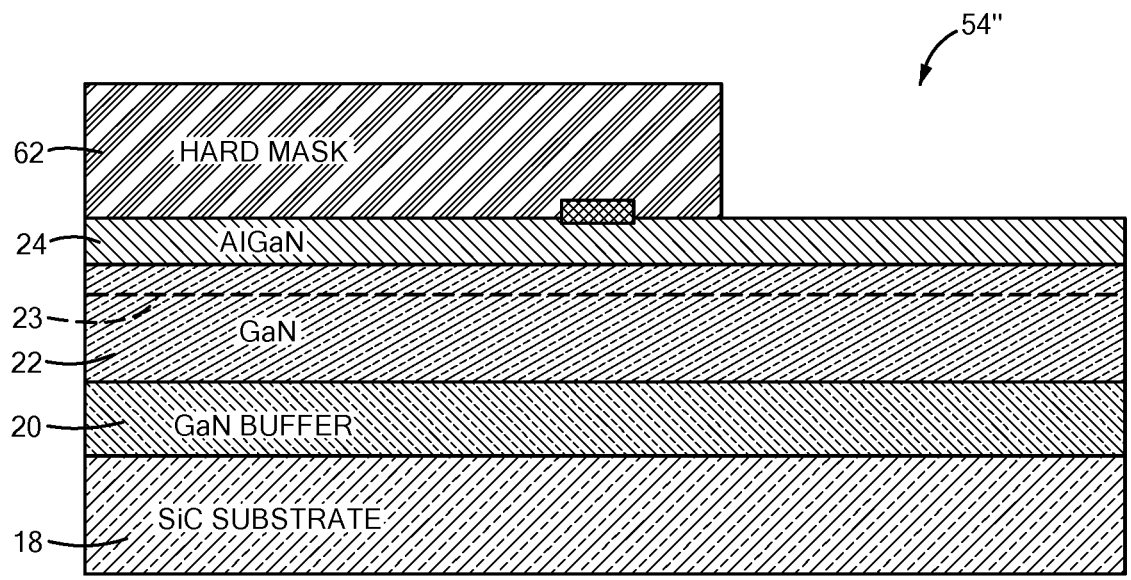
FIGS. 5A-5H are simplified diagrammatical sketches of the structure of FIG. 5 having both a D-Mode HEMT and an E-Mode HEMT at various stages in the manufacture thereof according to an alternative embodiment of the disclosure.

Referring now to FIG. 5 a simplified diagrammatical sketch of a semiconductor structure 10" having both the D-Mode HEMT 12 and an E-Mode HEMT 16" according to an alternative embodiment is shown. Here, referring to FIG. 5A, after forming the structure shown, and described above in connection with FIG. 3C, a hard mask 62 is lithography patterned to have a window 54" formed therein region where the E-mode HEMT 16" is to be formed.

Figure 5B:
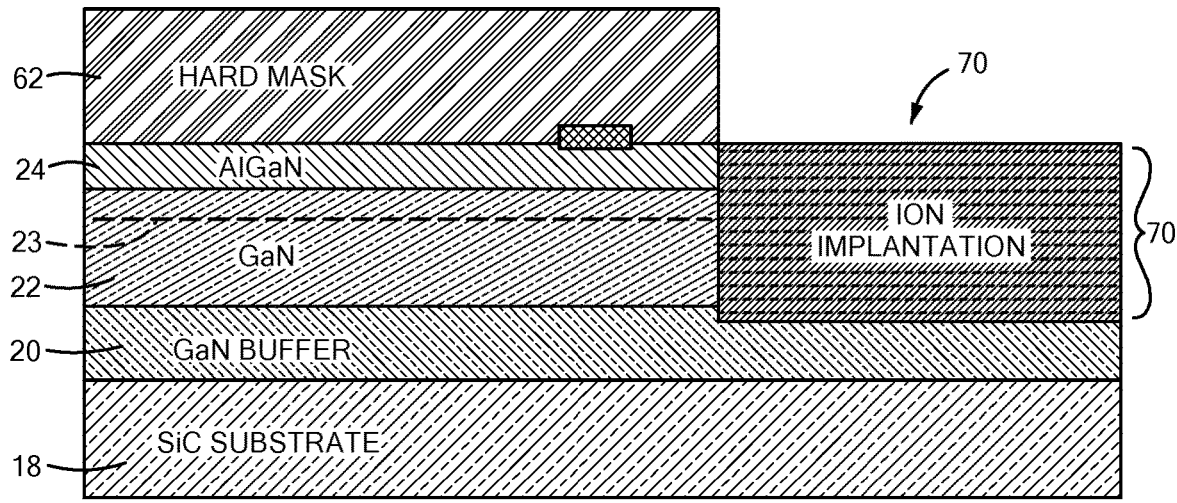

Here, referring to FIG. 5B, an ion implantation process is used to implant ions, here for example nitrogen ions, into a region 70 of the Group III-N layers 20, 22, and 24 not covered by the hard mask 62 to make the Group III-N material electrically resistive. The depth of the implanted region 70 is determined by the type of ion used and the acceleration energy and should extend through the AlGaN layer 24, the GaN channel layer 22, and into the upper portion of the doped GaN buffer layer 20. The implanted region 70 terminates below the depth of the 2DEG channel 23 and minimizes mobile carrier conduction in the portion of the 2DEG channel 23 below the E-mode HEMT 16", being formed.

Figure 5C:
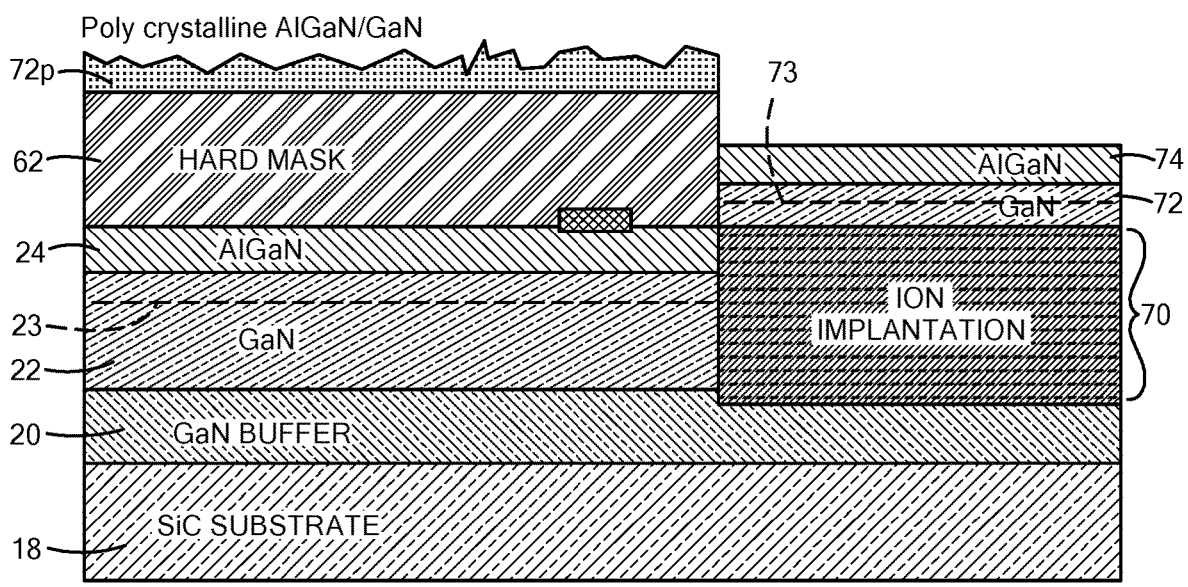

Next, referring to FIG. 5C, a layer of GaN 72 is grown by MBE over the upper surface of the structure shown in FIG. 5B, followed by an MBE grown layer of AlGaN 74. It is noted that the portions of the GaN layer 72 and the portions of the AlGaN layer 74 deposited on the hard mask form as polycrystalline layers 72p while the portions of the GaN layer 72 deposited on the AlGaN layer 24 grow epitaxially and the portions of the AlGaN layer 74 deposited on the GaN layer 72 grow epitaxially forming a 2DEG channel indicated by the dotted line 73 in the GaN layer 72, as shown. It is noted MBE epitaxially regrown GaN layer 72 is in direct contact with the ion implanted region 70.

Figure 5D:
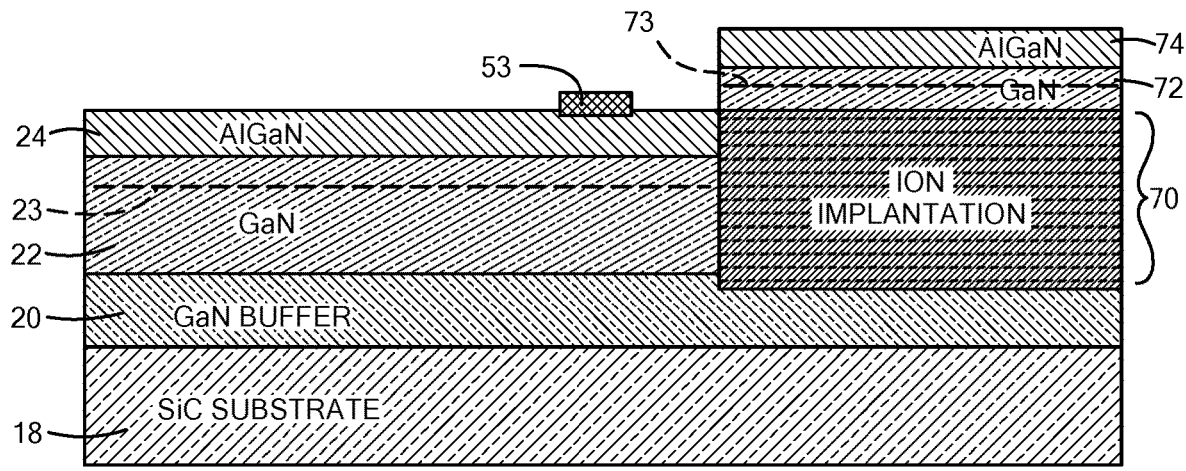

Next, referring to FIG. 5D, the hard 62 is etched away using for example a buffered oxide wet etch to remove a dielectric masking layer, along with the polycrystalline layers 72p on the hard mask 62, as shown.

Figure 5E:
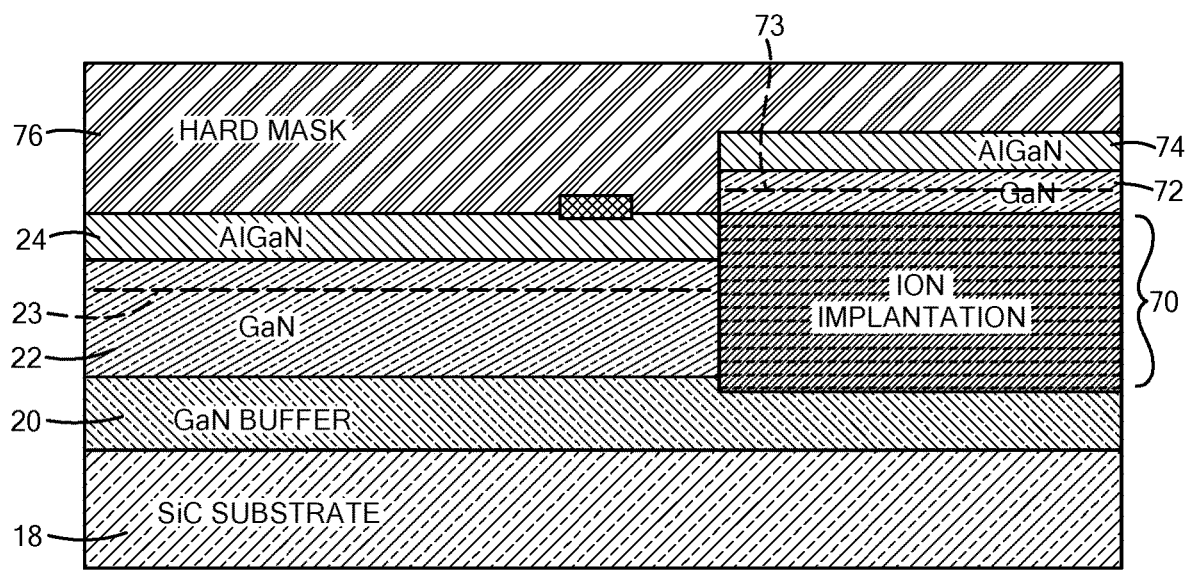

Referring now to FIG. 5E, a hard mask 76 is formed over the surface of the structure. Again, the hard mask 76 is a non-reactive dielectric such as, for example, $SiN_x$, $Al_2O_3$, $SiO_2$ or a stable metal.

Figure 5F:
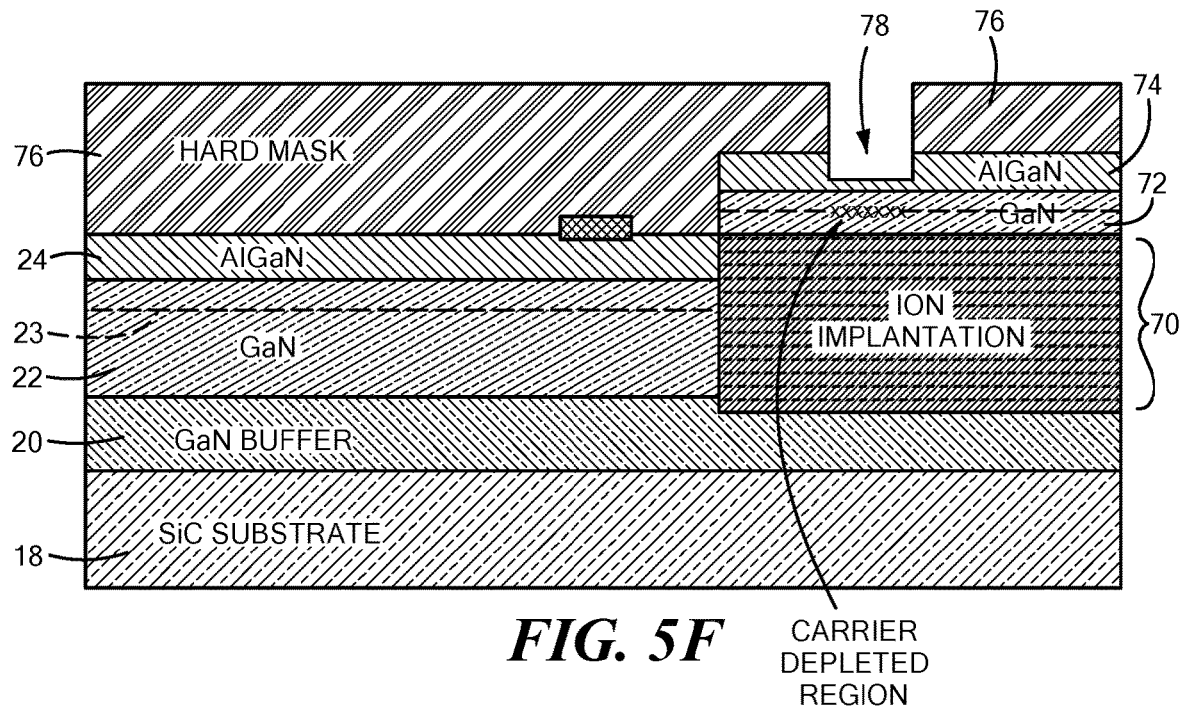

Referring now to FIG. 5F, the hard mask 76 is patterned with a window over the portion of the AlGaN layer 74 where a gate electrode is to be formed, as shown, and using an etchant, here for example, a dry plasma etch process and a recess 78 is etched into the upper portion of the AlGaN layer 74, as shown, so that only 50 Å to 180 Å of the AlGaN layer 74 remains.

Figure 5G:
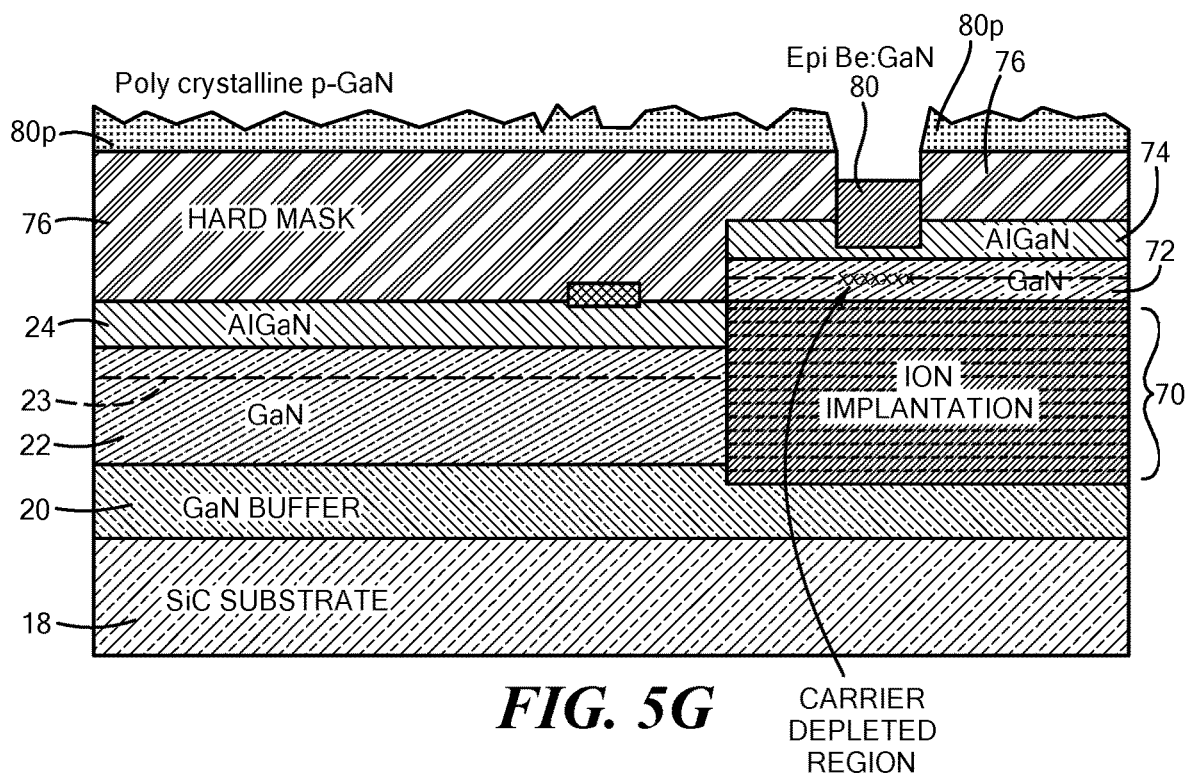

Referring now to FIG. 5G, a layer 80 of doped GaN, here Be:GaN, is grown by MBE over the upper surface of the structure shown in FIG. 5F; it is noted that the portions of the doped GaN layer 80 deposited on the hard mask 76 form as polycrystalline layer 80p while the portions of the doped GaN layer 80 deposited on the AlGaN layer 74 grow epitaxially as single crystal GaN, as indicated.

Figure 5H:
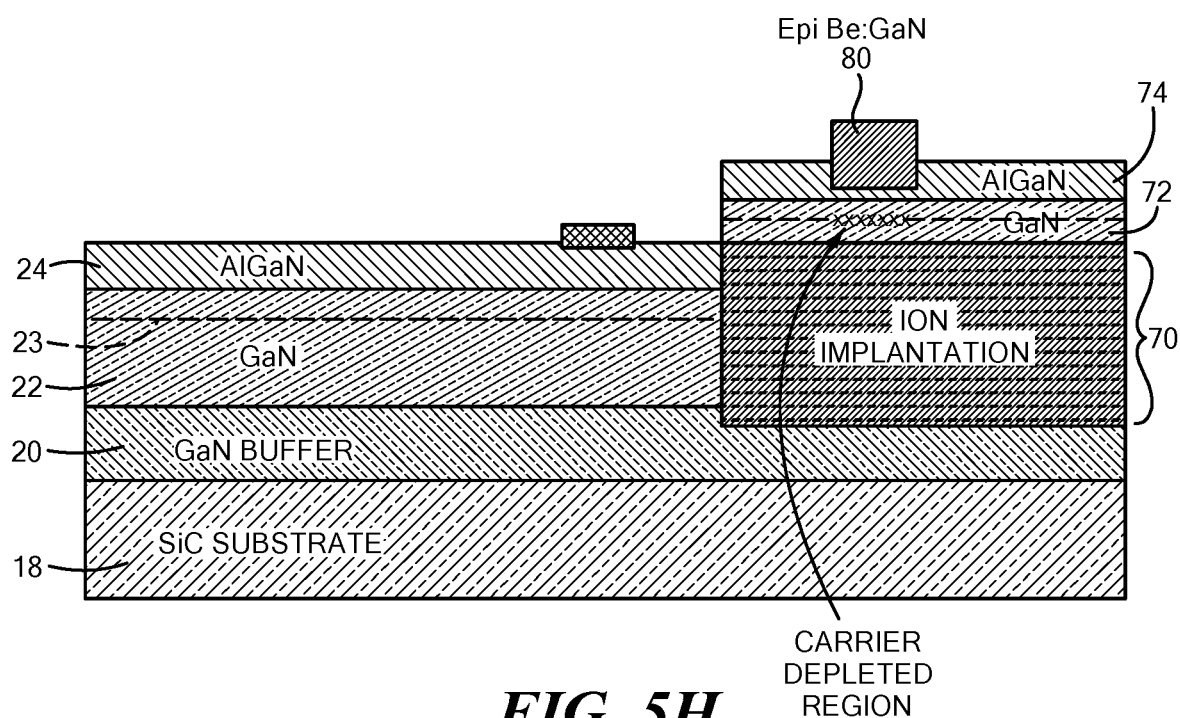

Next, referring to FIG. 5H, the hard mask 76 is etched away, using for example a buffered oxide wet etch to remove a dielectric masking layer, along with the polycrystalline layer 80p on the hard mask 76, as shown. Next, referring to FIG. 5, the D-mode HEMT and E-Mode HEMT processing is performed in parallel to form the structure 10" shown, having a D-Mode HEMT 12 with source, drain and gate electrodes 26, 28, 34, respectively, as shown, and an E-Mode HEMT 16" having source, drain and gate electrodes 36', 38' and 40", respectively, as shown; the gate electrode 40" being formed with a Schottky metal contact 82 in direct contact with the epitaxial doped Be:GaN material 80.

Figure 6:
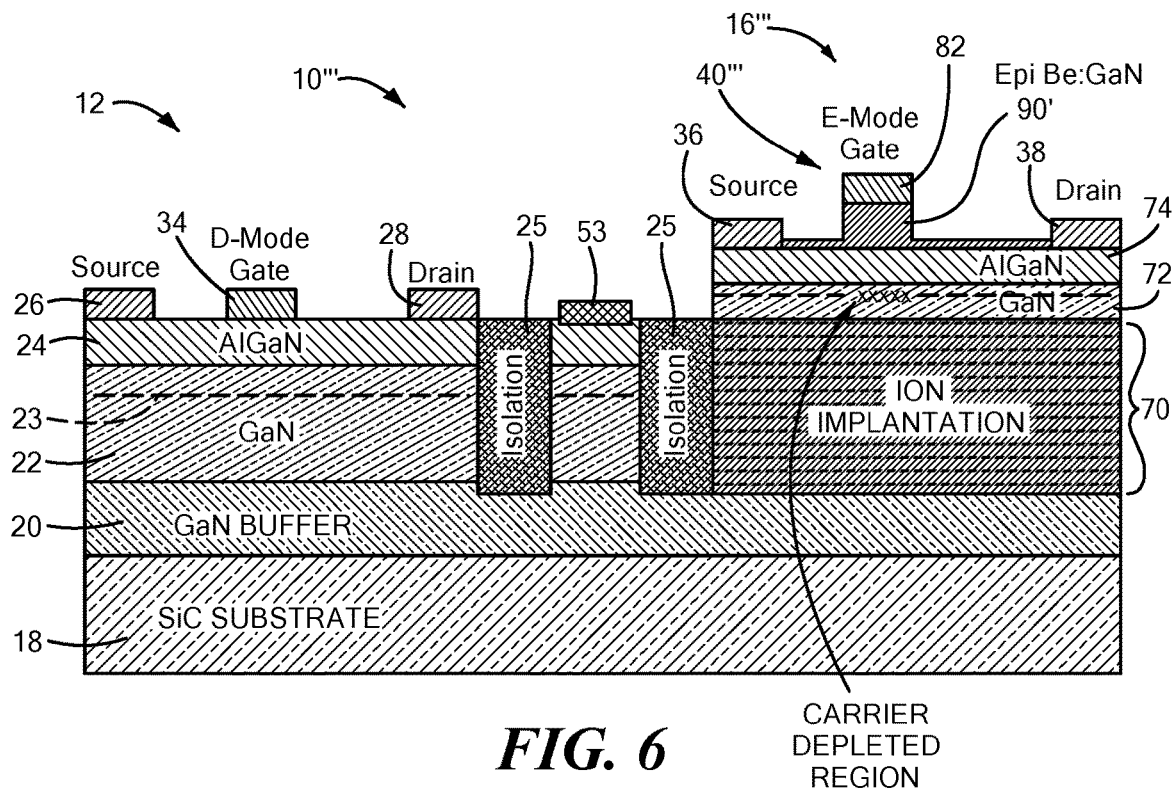
FIG. 6 is a simplified diagrammatical sketch of a structure having both a D-Mode HEMT and an E-Mode HEMT according to an alternative embodiment of the disclosure.
Figure 6A:
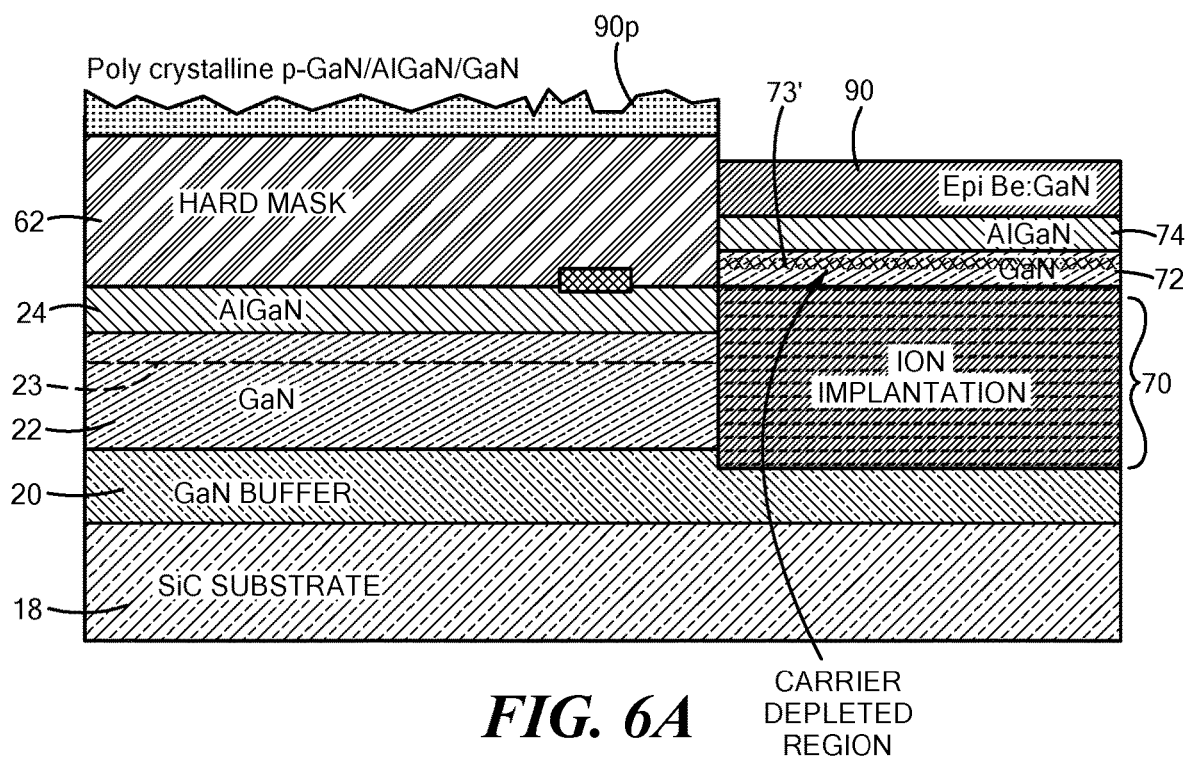
FIGS. 6A-6C are simplified diagrammatical sketches of the structure of FIG. 6 having both a D-Mode HEMT and an E-Mode HEMT at various stages in the manufacture thereof according to an alternative embodiment of the disclosure.

Referring now to FIG. 6 a simplified diagrammatical sketch of a semiconductor structure 10''' according to an alternative embodiment is shown. Here, and referring to FIG. 6A, after forming the structure shown, and described above in connection with FIG. 5B, a GaN layer 72 is grown by MBE in direct contact with the ion implanted region 70, followed by the MBE growth of an AlGaN layer 74, and then the MBE growth of a doped GaN layer 90, for example single crystal beryllium doped GaN (Be:GaN), as shown. The AlGaN layer 74 must be kept thin enough so that the doped GaN layer 90 can deplete the carriers in the 2DEG region 73' that would otherwise form at the interface of the GaN layer 72 and the AlGaN layer 74. It is noted that the portions of the GaN layer 72, AlGaN layer 74 and the doped GaN layer 90 form as a polycrystalline layer 90p on the mask 62, as indicated in FIG. 6A; however, the portions of the GaN layer 72, the AlGaN layer 74 and the doped GaN layer 90 deposited on the AlGaN layer 24 form as single Group III-N layers.

Figure 6B:
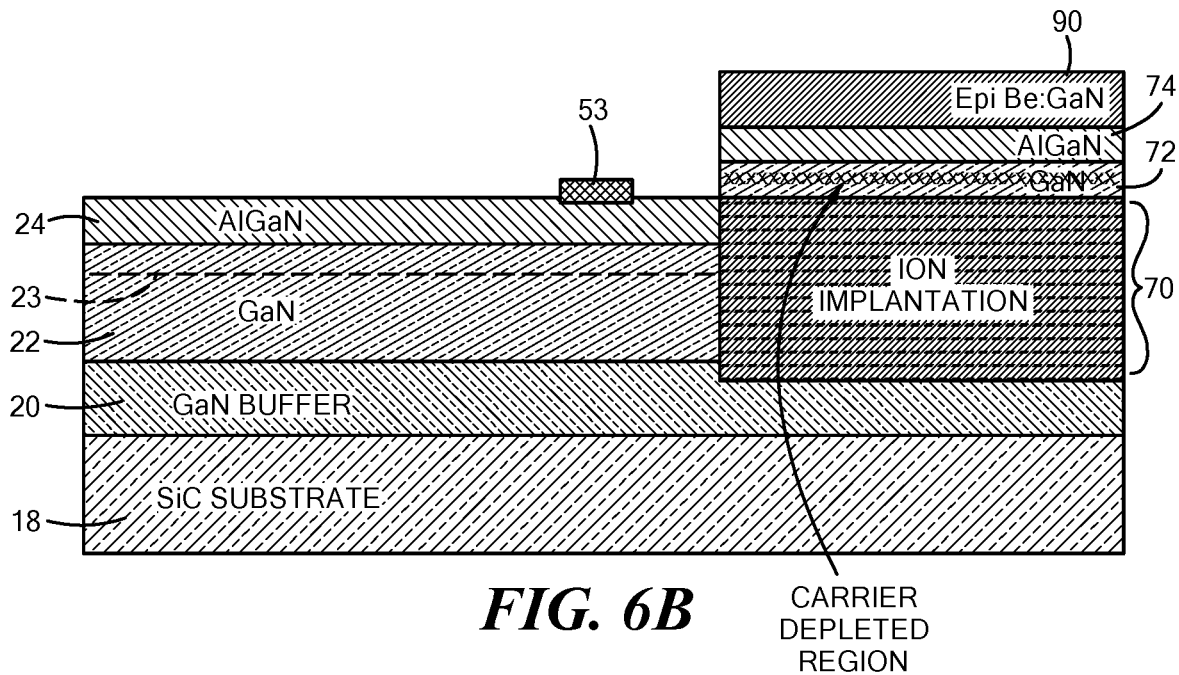

Next, referring to FIG. 6B, the hard mask 62 is etched away using for example a buffered oxide wet etch to remove a dielectric masking layer, along with the polycrystalline layer 90p on the hard mask 62, as shown.

Figure 6C:
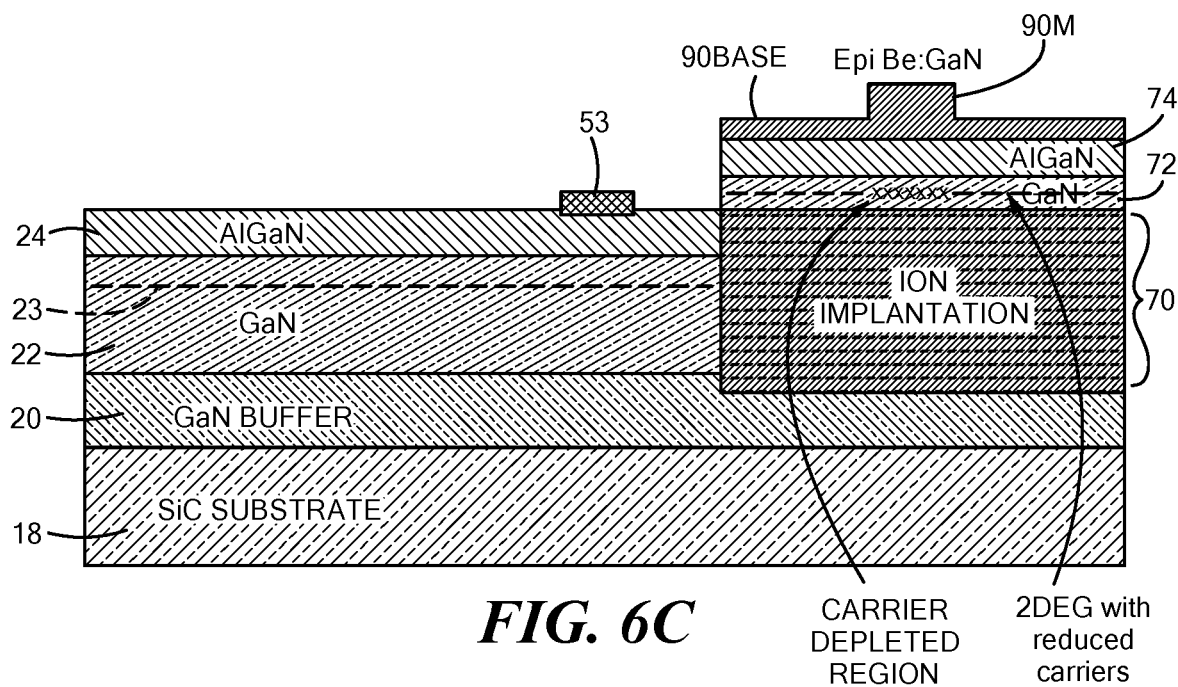

Next, referring to FIG. 6C, the doped GaN (Be:GaN) layer 90 is patterned lithographically and etched, here for example using a dry plasma etching process, to form a structure having a lower base portion 90BASE and a thicker, vertically projecting, mesa shaped, portion 90M, over where the epitaxial Be:GaN gate region is to be formed, as shown. The thickness of the dope GaN (Be:GaN) material 90 in the base portion 90BASE should be nominally as close to 0 Å as possible without etching the AlGaN layer 74 below the base portion 90BASE. Etching into the AlGaN layer 74 below the base portion 90BASE will reduce the total current that can be passed in the source and drain access regions of the E-Mode HEMT 16'''.

Next, referring to FIG. 6, the D-mode HEMT 12 and E-Mode HEMT 16''' processing is performed in parallel to form the structure 10''' shown, having a D-Mode HEMT with source, drain and gate electrodes 26, 28, 34, respectively, as shown, and an E-Mode HEMT 16''' having source, drain and gate electrodes 36, 38 and 40''', respectively, as shown; the gate electrode 40''' being formed with a Schottky metal contact 82 in direct contact with the epitaxial doped GaN mesa portion 90M. It is noted that the GaN layer 72 serves as a channel layer and the AlGaN layer 74 serves as a barrier layer.

Figure 7:
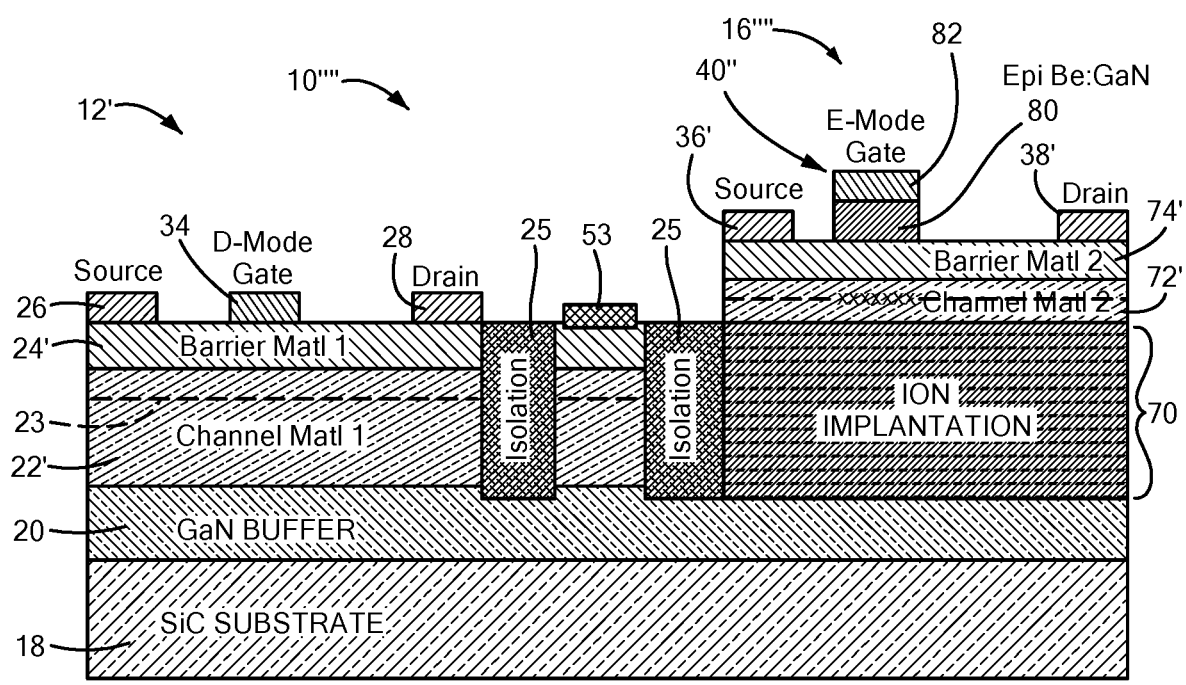
FIG. 7 is a simplified diagrammatical sketch of a structure having both a D-Mode HEMT and an E-Mode HEMT according to an alternative embodiment of the disclosure.

Referring now to FIG. 7 a simplified diagrammatical sketch of a semiconductor structure 10'''' according to an alternative embodiment is shown. The structure is fabricated in a similar manner as the alternative embodiments shown in FIG. 5 and FIG. 6, where a fraction of the original 2DEG channel 23 is processed such that the 2DEG is no longer electrically conductive and a new Group III-N structure is grown on the electrical inactive 2DEG channel 23 for the purposes of forming an E-mode HEMT 16''''. FIG. 7 shows that this processing allows for different channel materials 22', 72' and barrier materials 24', 74' to be used in a D-Mode HEMT 12' and the E-mode HEMT 16''''. The ability to use different layer constructions in E-mode and D-mode HEMTs on the same wafer allows the materials to be tailored to provide a larger range electrical performance.

A number of embodiments of the disclosure have been described. Nevertheless, it will be understood that various modifications may be made without departing from the spirit and scope of the disclosure. For example, while Be doped GaN has been described, it should be understood that other Group III-N doped material may be used such as doped AlGaN. Similarly, the use of different Group III-N channel and barrier layers than GaN and $Al_{0.25}Ga_{0.75}N$ will require E-mode gate regions with different thicknesses for the barrier layer and the beryllium doped Group III-N layers to achieve a desired threshold voltage. Although SiC substrates have been used to illustrate various embodiments of the disclosure, the disclosure does not depend on the use of any specific substrate and can be applied to any D-Mode Group III-N HEMT material whether it is grown on a substrate, for example, Si, $Al_2O_3$, and Group III-N, or if the HEMT is free-standing or mounted to another substrate. Accordingly, other embodiments are within the scope of the following claims.

What is claimed is:

1. An Enhancement-Mode HEMT, comprising:
   a pair of stacked Group III-Nitride semiconductor layers, the pair of stacked Group III-Nitride semiconductor layers forming a heterojunction with a 2DEG channel being formed in a lower one of the pair of stacked Group III-Nitride layers;
   a source electrode disposed over an upper one of the pair of stacked Group III-Nitride layers;
   a drain electrode disposed over an upper one of the pair of stacked Group III-Nitride layers;
   a gate electrode disposed between the source electrode and drain electrode, the gate electrode comprising:
      a layer of Group-III Nitride material having a dopant; disposed between an electrically conductive gate electrode contact and extending into an upper one on the pair of stacked Group III-Nitride layers such dopant providing the layer with a resistivity greater than the predetermined resistivity of the Group III-Nitride material, the gate electrode contact in Schottky contact with the layer of beryllium doped Group-III Nitride material and depleting carriers from the 2DEG channel under the gate at zero bias condition.

2. An Enhancement-Mode HEMT comprising:
a gate electrode disposed between a source electrode and a drain electrode, the gate electrode comprising:
 a layer, disposed between an electrically conductive gate electrode contact and a pair of stacked Group III-Nitride semiconductor layers, the pair of stacked Group III-Nitride semiconductor layers forming a heterojunction with a 2DEG channel being formed in a lower one of the pair of stacked Group III-Nitride layers
 such layer comprising: a Group III-N material, the Group III-N material having a predetermined resistivity and a beryllium dopant disposed in the Group III-N material, such beryllium dopant providing the layer with a resistivity greater than the predetermined resistivity of the Group III-N material, and depleting carriers from the 2DEG channel under the gate electrode when an applied gate voltage is less than a threshold voltage.

3. The HEMT recited in claim 1 wherein the dopant is Beryllium.

4. The HEMT recited in claim 1 wherein the dopant is Molecular Beam Epitaxy Beryllium.

5. The HEMT recited in claim 2 wherein the gate electrode extends into an upper one of the pair of stacked Group III-Nitride semiconductor layers.

6. The HEMT recited in claim 2 wherein the beryllium dopant is Molecular Beam Epitaxy Beryllium.

7. An Enhancement-Mode HEMT, comprising:
 a crystal structure having a pair of stacked Group III-N semiconductor layers, the pair of stacked Group III-N semiconductor layers forming a heterojunction with a 2DEG channel being formed in a lower one of the pair of stacked Group III-N layers
 a source electrode for supplying current to the 2DEG channel;
 a drain electrode for extracting current supplied current from the 2DEG channel; and
 a gate electrode, disposed between the source electrode and the drain electrode and over the pair of stacked Group III-N semiconductor layers for controlling the supplied current passing to the drain electrode;
 such gate electrode; comprising:
 an electrically conductive gate electrode contact; and
 a doped; Group III-N material; disposed between the electrically conductive gate electrode contact and extending into an upper one of the pair of stacked Group III-N semiconductor layer, such doped, Group III-N material increasing resistivity of the Group III-N material and provides the HEMT with a threshold voltage greater than zero.

8. The structure recited in claim 7 wherein the doped, Group III-N material forces the Fermi level in the doped Group III-N material to reside close enough to the valance band edge to raise the conduction band at the interface between the pair of stacked Group III-N semiconductor layers to deplete carriers from the portion of the 2DEG channel under the gate contact at zero bias condition.

9. The structure recited in claim 7 wherein the doped, Group III-N material is grown by Molecular Beam Epitaxy.

10. The structure recited in claim 7 wherein the gate electrode comprises a single doped, Group III-N material.

11. The structure recited in claim 8 wherein the doped, Molecular Beam Epitaxy Group III-N material comprises Beryllium.

12. An Enhancement-Mode HEMT structure comprising a gate electrode disposed between a source electrode and a drain electrode, the gate electrode comprising;
 a doped, Group III-N material disposed between an electrically conductive gate electrode contact and extending into an upper one of a pair of stacked Group III-N semiconductor layer such doped, Group III-N layer increasing resistivity of the Group III-N material and depleting 2DEG channel under the gate electrode at zero bias.

13. An Enhancement-Mode HEMT comprising a gate electrode with a layer of doped; Group III-N material disposed between an electrically conductive gate electrode contact and an upper one of a pair of stacked Group III-N semiconductor layers, such doped; Group III-N layer increasing resistivity of the Group III-N material and depleting carriers from a 2DEG channel under the gate electrode when an applied gate voltage is less than a threshold voltage, and the threshold voltage is greater than zero, the doped Group III-N layer having a thickness greater than 250 Å and the upper one of a pair of stacked Group III-N semiconductor layers having a thickness less than 180 Å.

14. A structure, comprising:
 a single crystal substrate;
 a Depletion mode (D-mode) HEMT and an Enhancement mode (E-mode) HEMT formed on the single crystal substrate; the Enhancement-Mode HEMT having a gate electrode with a doped; Group III-N material disposed between an electrically conductive gate electrode contact and extending into an upper one of a pair of stacked Group III-N semiconductor layers of the Enhancement-Mode HEMT, such doped; Group III-N layer increasing resistivity of the Group III-N material and depleting carriers from a 2DEG channel under the gate when an applied gate voltage is less than a threshold voltage, and the threshold voltage is greater than zero.

* * * * *